United States Patent
Schreiber et al.

(10) Patent No.: US 6,507,947 B1
(45) Date of Patent: Jan. 14, 2003

(54) PROGRAMMATIC SYNTHESIS OF PROCESSOR ELEMENT ARRAYS

(75) Inventors: Robert S. Schreiber, Palo Alto, CA (US); B. Ramakrishna Rau, Los Altos, CA (US); Shail Aditya Gupta, Sunnyvale, CA (US); Vinod K. Kathail, Cupertino, CA (US); Sadun Anik, Akatlar (TR)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/378,298

(22) Filed: Aug. 20, 1999

(51) Int. Cl.⁷ .................................................. G06F 9/45
(52) U.S. Cl. ........................ 717/160; 717/159; 717/161
(58) Field of Search ................................. 717/9, 2, 6, 5, 717/159, 160, 161, 149, 150, 151; 712/241; 709/102, 103, 104, 105, 106, 107, 108

(56) References Cited

U.S. PATENT DOCUMENTS

| | | | | |
|---|---|---|---|---|
| 5,230,053 A | * | 7/1993 | Zaiki .............................. | 717/6 |
| 5,442,790 A | * | 8/1995 | Nosenchuck ................... | 717/7 |
| 5,579,494 A | * | 11/1996 | Zaiki .............................. | 717/6 |
| 5,787,272 A | * | 7/1998 | Gupta et al. ................. | 709/400 |
| 5,802,375 A | * | 9/1998 | Ngo et al. ...................... | 717/9 |
| 5,832,272 A | * | 11/1998 | Kalantery ...................... | 717/6 |
| 5,852,734 A | * | 12/1998 | Komatsu et al. ................ | 717/7 |
| 5,890,134 A | * | 3/1999 | Fox ................................ | 717/9 |
| 6,016,399 A | * | 1/2000 | Chang ........................... | 717/9 |
| 6,041,181 A | * | 3/2000 | Ju et al. ......................... | 717/9 |
| 6,058,266 A | * | 5/2000 | Megiddo et al. ................ | 717/9 |
| 6,059,841 A | * | 5/2000 | Caracuzzo ..................... | 717/9 |
| 6,070,011 A | * | 5/2000 | Liu et al. ........................ | 717/9 |
| 6,226,776 B1 | | 5/2001 | Panchul ......................... | 716/3 |

OTHER PUBLICATIONS

Calinescu. A BSP Approach to the Scheduling of Tightly–Nested Loops. IEEE. 1997. pp. 549–553.*
Leonardi et al. Nested Loops Optimization for Multiprocessor Architecture Design. IEEE. 1998. pp. 415–418.*
Yang et al. On Symbolic Scheduling and Parallel Complexity of Loops. IEEE. 1995. pp. 360–367.*
IBM Technical Disclosure Bulletin. Automatic Parallelization of Loops in Sequential Code. Jul., 1987. pp. 731–735.*
Aditya et al., "Elcor's Machine Description System: Version 3.0," HPL–98–128, Oct. 1998, pp. 1–75.
Rau et al., "Machine–Description Driven Compilers for EPIC Processors," HP Laboratories Technical Report, HPL–98–40, Sep. 1998, pp. 1–82.
Kathail et al., "HPL PlayDoh Architecture Specification: Version 1.0," HP Laboratories Technical Report, HPL–93–80, Feb. 1994, pp. 1–48.
Rainer Leupers, Peter Marwedel, "Retargetable Generation of Code Selectors from HDL Processor Models," IEEE, 1997, pp.140–144.
George Hadjiyiannis, Silvina Hanono, Srinivas Devadas, "ISDL: An Instruction Set Description Language for Retargetability," ACM, 1997, pp. 299–302.

(List continued on next page.)

*Primary Examiner*—Gregory Morse
*Assistant Examiner*—Wei Zhen

(57) ABSTRACT

A programmatic method transforms a nested loop in a high level programming language into a set of parallel processes, each a single time loop, such that the parallel processes satisfy a specified design constraint. Another programmatic method synthesizes a processor array from the set of parallel processes and a specified design constraint.

27 Claims, 21 Drawing Sheets

OTHER PUBLICATIONS

Gyllenhaal et al., "HMDES Version 2.0 Specification," Hewlett Packard Laboratories Technical Report IMPACT–96–3, (Published before Aug. 20, 1999).

Hadjiyiannis et al., "A Methodology for Accurate Performance Evaluation in Architecture Exploration." (Published before Aug. 20, 1999).

Hoogerbrugge et al., "Automatic Synthesis of Transport Triggered Processors." (Published before Aug. 20, 1999).

Corporaal et al., "MOVE: A Framework for High–Performance Processor Design," ACM, 1991, pp. 692–701.

Corporaal et al., "Cosynthesis with the MOVE Framework." (Published before Aug. 20, 1999).

Lanneer et al, "Chapter 5—Chess: Retargetable Code Generation for Embedded DSP Processors," Code Generation for Embedded Processors, Kluwer Academic Publication, pp. 85–102. (Published before Aug. 20, 1999).

Fauth, "Chapter 8—Beyond Tool–Specific Machine Descriptions," Code Generation for Embedded Processors, Kluwer Academic Publications, pp. 138–152.

Quinton et al., *Systolic Algorithms & Architectures,* Prentice Hall, 1991, pp. 283–339.

Park et al., "Sehwa: A Software Package for Synthesis of Pipelines from Behavioral Specifications," IEEE, Mar. 1988, vol. 7, No. 3, pp. 356–370.

Megson et al., "A Synthesis Method of LSGP Partitioning of Given–Shape Regular Arrays," IEEE, 1995, pp. 234–238.

Chen et al., "A General Methodology of Partitioning and Mapping for Given Regular Arrays," *IEEE Transactions on Parallel and Distributed Systems,* vol. 6, No. 10, pp. 1100–1107.

Darte A., "Regular Partitioning for Synthesizing Fixed–Size Systolic Aarrays," Integration, *The VLSI Journal,* vol. 12, 1991, pp. 293–304.

Rim et al., "Optimal and Heuristic Algorithms for Solving the Binding Problem," Madison, WI, Sep. 10, 1993.

DeMan et al., "Cathedral–II–A Computer–Aided Synthesis System for Digital Signal Processing VLSI Systems," *Computer Aided Engineering Journal,* Apr. 1988, pp. 55–66.

Darte et al., "Partitioning for Array Processors," Tech. Rep, LIP, ENS Lyon,1990, pp. 1–17.

\* cited by examiner

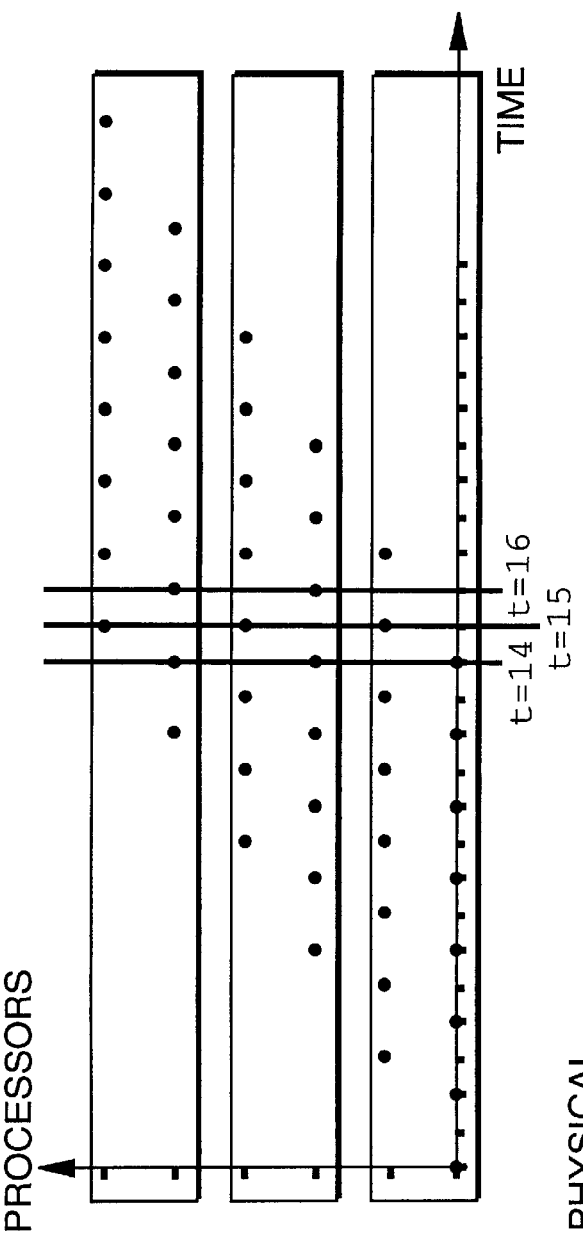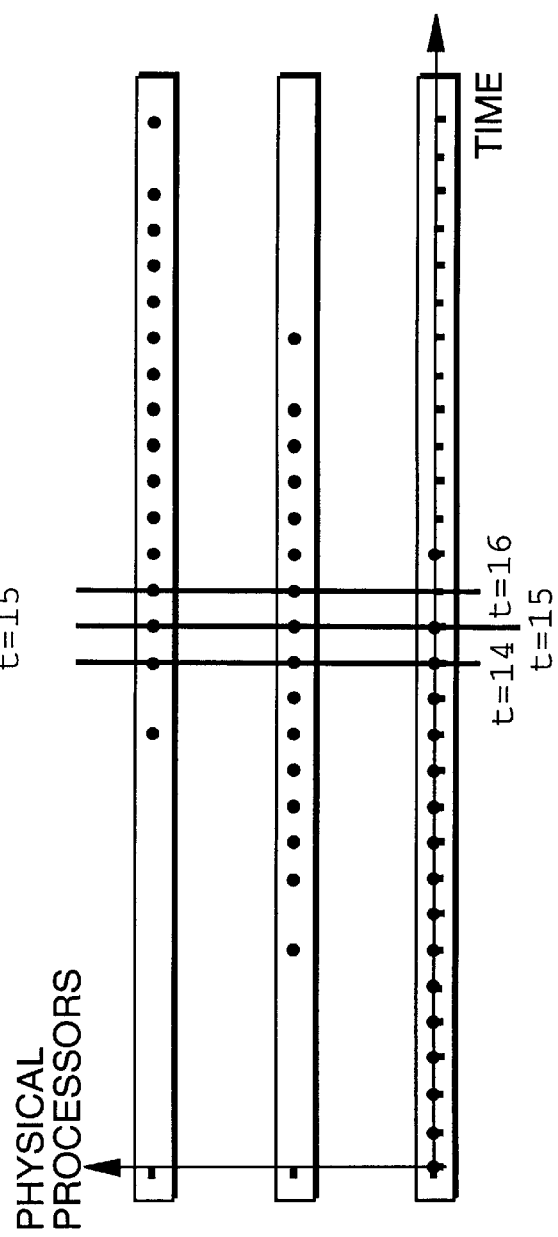
FIG. 10
FIG. 11

NPA Design

PROGRAMMATIC SYNTHESIS OF PROCESSOR ELEMENT ARRAYS

RELATED APPLICATION DATA

This patent application is related to the following co-pending applications filed concurrently herewith:

U.S. patent application Ser. No. 09/378,395, now U.S. Pat. No. 6,385,757, entitled, "AUTOMATIC DESIGN OF VLIW PROCESSORS" by Shail Aditya Gupta, Bantwal Ramakrishna Rau, Vinod Kumar Kathail, and Michael S. Schlansker;

U.S. patent application Ser. No. 09/378,393, now U.S. Pat. No. 6,438,747, entitled, "PROGRAMMATIC ITERATION SCHEDULING FOR PARALLEL PROCESSORS" by Robert Schreiber, Bantwal Ramakrishna Rau and Alain Darte;

U.S. patent application Ser. No. 09/378,397, now U.S. Pat. No. 6,374,403, entitled, "PROGRAMMATIC METHOD FOR REDUCING COST OF CONTROL IN PARALLEL PROCESSES" by Alain Darte and Robert Schreiber;

U.S. patent application Ser. No. 09/378,431, now U.S. Pat. No. 6,460,173, entitled, "FUNCTION UNIT ALLOCATION IN PROCESSOR DESIGN" by Robert Schreiber;

U.S. patent application Ser. No. 09/378,295, now U.S. Pat. No. 6,298,471, entitled, "INTERCONNECT MINIMIZATION IN PROCESSOR DESIGN" by Robert Schreiber; and U.S. patent application Ser. No. 09/378,290, now U.S. Pat. No. 6,408,428, entitled, "AUTOMATED DESIGN OF PROCESSOR SYSTEMS USING FEEDBACK FROM INTERNAL MEASUREMENTS OF CANDIDATE SYSTEMS" by Michael S. Schlansker, Vinod Kumar Kathail, Greg Snider, Shail Aditya Gupta, Scott A. Mahlke and Santosh G. Abraham.

These patent applications are hereby incorporated by reference.

TECHNICAL FIELD

The invention relates to automated design systems for synthesizing digital hardware from behavioral descriptions, and relates to parallel compiler methods, and compiler methods for exploiting instruction level parallelism.

BACKGROUND

The continued rapid growth of the consumer electronics industry demands low-cost and low power digital electronics that perform signal processing and other data handling tasks at impressive computational rates. Many current designs employ embedded general purpose computers that must be assisted by application-specific hardware, which may or may not be programmable, to meet the computational demands at low cost. Such systems are difficult and expensive to design. As such, there is a demand for automated design tools that assist in the synthesis of application specific computers.

Despite this demand, there is a lack of design software that effectively automates the synthesis of complex processors. Behavioral synthesis programs are available that are capable of generating a structural hardware description from a high level behavioral description. However, such programs are typically limited in the types of behavioral descriptions that they can synthesize. In addition, they are not designed to synthesize complex processor arrays that exploit various forms of parallelism. This is a significant drawback because many applications today can benefit significantly from the performance advantages that these forms of parallelism can provide.

One significant way to enhance performance in a computer is to exploit parallelism. In the field of computer architecture, there are various forms of parallelism. One form of parallelism involves the use of two or more processors that execute portions of a computing task in parallel. Examples of computer architectures that exploit this form of parallelism include shared-memory or distributed memory multi-processor systems. Parallel compilers are designed to compile a program into parallel code for execution on multi-processor systems. Unfortunately, these parallel compilers are typically of little use in the design of application specific computers since they are programmed to convert code into a parallel form for a specific architecture that often does not meet the design constraints of the application.

Another form of parallelism is Instruction Level Parallelism (ILP). Usually, this form of parallelism is found inside a processor. Processors that exploit ILP are capable of executing two or more operations concurrently. Examples of these types of processors include Explicitly Parallel Instruction Computing (EPIC) and superscalar processors. One type of EPIC processor is a Very Long Instruction Word (VLIW) processor. A VLIW processor exploits ILP by issuing two or more operations per instruction.

There are a variety of ILP compiler technologies for EPIC processors that optimize application programs to exploit the ILP of a VLIW processor. However, these compiler technologies are traditionally designed for specific hardware architectures. As such, they are not suitable for the design application specific processors, where the developer wishes to explore a variety of potential designs tailored to an application.

SUMMARY

The invention provides a programmatic method for transforming a sequential nested loop in a high level programming language into a set of parallel processes, each a single time loop, such that the parallel processes satisfy a specified design constraint. This method is implemented in a parallel compiler that transforms a sequential loop nest into optimized parallel code. The invention also provides a method for synthesizing a processor array from the set of parallel processes and a specified design constraint. This method is implemented in a programmatic synthesis system for generating a structural hardware description (e.g., VHDL) from the optimized parallel code. These methods may be used alone or in combination. Together, they form a design flow method for programmatically transforming a nested loop into a structural hardware description of a processor array.

One aspect of the invention is a method for transforming a nested loop into a set of parallel processes and synthesizing the parallel processes into a parallel array of processor elements. The method starts with a sequential loop nest and a cost or performance constraint requirement that the array must satisfy. One example of this constraint is the throughput of a processor element in the array. Using this specified performance as a constraint, the method programmatically transforms the nested loop into parallel processes, where each of the parallel processes corresponds to a set of iterations of the loop body. After transforming the code, the method represents the nested loop as a single loop mapped to a processor element. Also, each iteration of the nested loop is assigned a start time to initiate execution on a processor element. Next, the method programmatically synthesizes the parallel processes into a structural description of an array of processor elements capable of executing the nested loop.

Another aspect of the invention is a method for synthesizing a set of parallel processes, each comprising a single loop in parallel form, into a parallel array of processor elements. The method synthesizes a structural representation of a data path for a processor element that executes the single loop based on operations in the single loop. It schedules the operations in the single loop for execution in the data path with the requirement that the schedule must satisfy a design constraint such as processor cost or performance. The method programmatically synthesizes an interconnect between functional units and local storage in the data path for each processor element, and programmatically replicates and interconnects the processor elements into a parallel array.

There are a variety of features of the methods and systems outlined above. The system may be implemented to transform the code so as to optimize it for the synthesis in terms of processor cost, performance or both cost and performance. The system exploits parallelism at the processor level and at the instruction level to synthesize a sequential loop nest into hardware that satisfies cost and/or performance constraints. The system may also utilize predicated execution to remove conditional statements from the loop nest. One particular use of predicates is to test loop boundary conditions. This application of predicates reduces the cost of control logic in the synthesized array.

Yet another aspect of the invention is an array of processor elements each having one or more functional units or registers. The functional units support predicated execution of operations. The interconnect that transfers data from the functional units to the registers uses the predicates to control which functional units transfer data into a given register.

Further features and advantages of the invention will become apparent from the following detailed description and drawings.

BRIEF DESCRIPTION OF THE DRAWINGS

FIG. 10 shows the result of mapping iterations (the points) from an iteration space to a time—virtual processor space. The vertical lines represent a start time for initiating all iterations that lie on the line.

FIG. 11 shows the result of mapping iterations from virtual processor—time space of FIG. 10 to physical processor—time space.

DETAILED DESCRIPTION 1.0 Introduction

Figure 1:
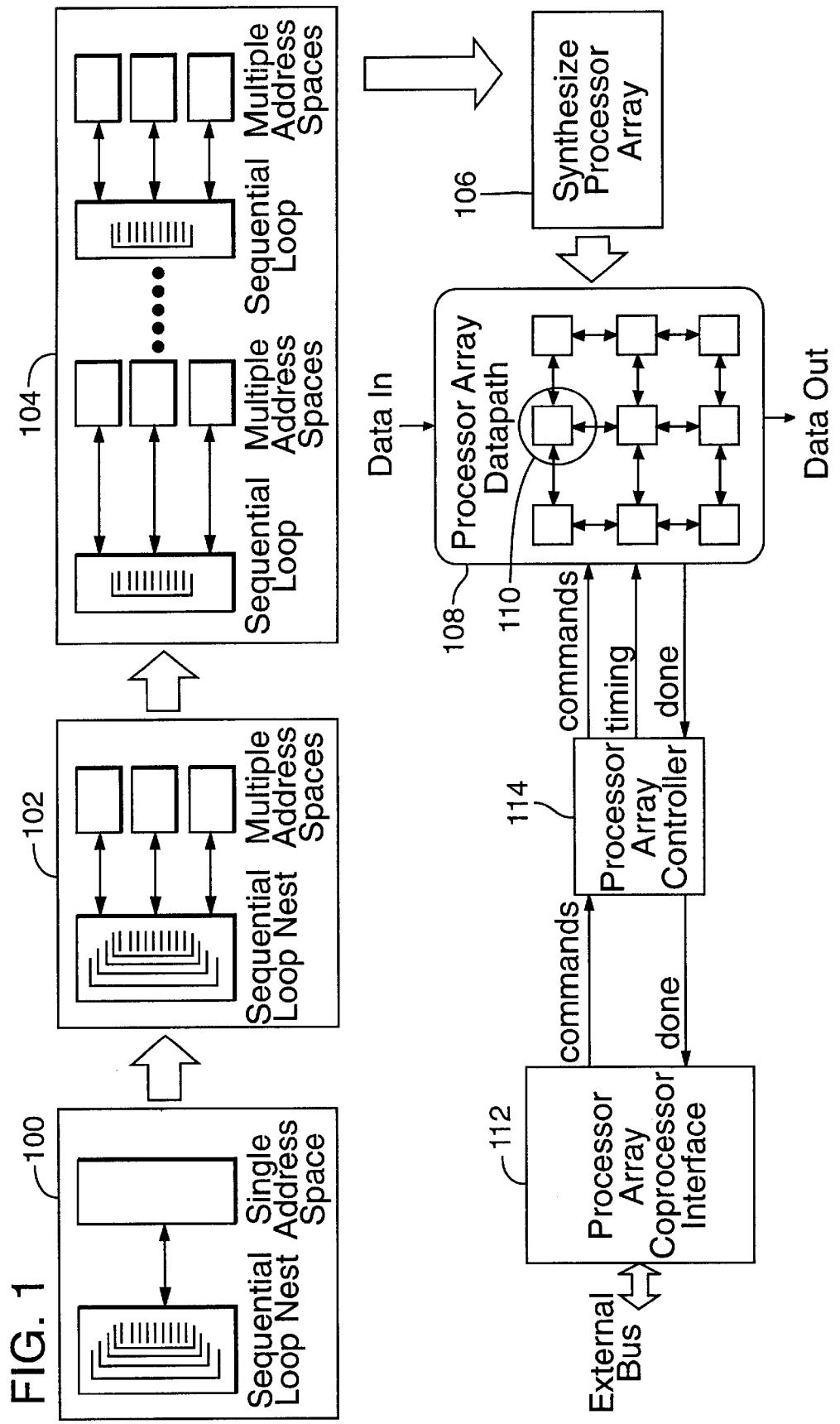
FIG. 1 is a conceptual overview of a design flow for transforming a nested loop and specified processor constraints into a structural description of a processor array.

The features summarized above are implemented in an automated design system. Before describing aspects of this system in more detail, we begin with a section of definitions of terms used throughout the document. We then provide an overview of the system and its methods in Section 3. Finally, Sections 4–6 describe components and alternative implementations of the system in more detail.

2.0 Definitions

Nested Loop

A nested loop refers to a program in a high level language such as C, Java, Pascal etc. that has an n-deep loop nest, where n is an integer. For example, a three deep loop nest may take the form:

```
for i = i0, n1
  for j = j0, n2
    for k = k0, n3
      {loop body
       ...
      }
```

Single Loop A single loop is a loop over a single dimension. For example, a single loop may take the form:

for t=tmin to tmax {
  Loop body
}

Time Loop

A single loop in which the iteration variable (t in the above example) refers to time.

Iteration Space

An iteration space refers to the coordinate space of an n-deep nested loop. This is a geometric view of an n-deep nested loop. Each point in the iteration space represents the computation corresponding to one iteration of the loop body and each dimension of the iteration space corresponds to a level of the loop nest. The coordinates of a point in the iteration space are given by the values of the iteration variables of the loop nest, i.e., i, j and k in the above example.

Processor Element

A processor element is a unit of processing resources that is intended to be replicated into an interconnected array of processor elements. Typically, it has a local storage (i.e. one or more local memories, local registers and local FIFOs) and includes one or more functional units for executing operations.

The processor element may be programmable or non-programmable. The primary difference between programmable and non-programmable processors lies in the way that their control logic is designed. There are the following two broad approaches for designing the control logic.

1. Finite state machine (FSM) based control: In this approach, there is no program stored in memory; the processor contains all of the control logic in the form of a finite state machine. The FSM can be implemented using hard-wired logic in which case the processor is non-programmable and can execute only one program. It can also be implemented using "reconfigurable" hardware such as FPGAs or certain types of PLAs. In this case, the processor can be re-configured to execute a different program.
2. Program counter based control: In this approach, the control is expressed in the form of a program consisting of a sequence of instructions stored in a program memory. The processor contains a program counter (PC) that contains the memory address of the next instruction to execute. In addition, the processor contains control logic that repeatedly performs the following sequence of actions:
   A. Fetch instruction from the address in the PC.
   B. Decode the instruction and distribute the control to the control points in the processor datapath.
   C. Update the PC as follows. If the instruction just executed contains either an implicit or explicit branch and the branch was taken, then the new value of the PC is the branch target address specified in the instruction. In all other cases, the next value of the PC is the address of the next instruction in the program.

Virtual Processor

A virtual processor is one of the processors in a linear mapping of an n-deep nested loop to an (n−1) dimensional processor array. Each virtual processor may be thought of as a single process. Possibly one, but typically two or more virtual processors are assigned to a physical processor element in a processor array.

Physical Processor Element

A physical processor element refers to a processor element that is implemented in hardware.

Tile

A tile is a set of iterations generated by partitioning the iteration space of a nested loop into sets of iterations, where the sets are capable of being initiated and completed sequentially. Iterations within the tile may be executed in a parallel fashion.

Cluster

A cluster is a multi-dimensional, rectangular array of virtual processors that map to a single physical processor in a processor array. The clusters corresponding to physical processors are disjoint, and their union includes all of the virtual processors.

Expanded Virtual Register (EVR)

An infinite, linearly ordered set of virtual registers with a special operation, remap( ), defined upon it. The elements of an EVR, v, can be addressed, read, and written as v[n], where n is any integer. (For convenience, [0] may be referred to as merely v.) The effect of remap(v) is that whatever EVR element was accessible as v[n] prior to the remap operation will be accessible as v[n+1] after the remap operation.

EVRs are useful in an intermediate code representation for a compiler because they provide a convenient way to reference values from different iterations. In addition to representing a place to store values, EVRs also express dependences between operations, and in particular, can express dependences between operations in different iterations. While useful in scheduling operations, EVRs are not necessary because dependence information may be specified in other ways. For example, a compiler may perform loop unrolling and provide dependence distances for scheduling the operations.

Uniformized Array

An array of virtual registers such that there is a one-to-one mapping between the elements of the uniformized array and the iterations of a loop nest. Each element of the uniformized array is assigned a value exactly once by a particular operation of the corresponding iteration.

Dynamic Single Assignment (DSA)

A program representation in which the same virtual register, EVR element or uniformized array element is never assigned to more than once on any dynamic execution path. The static code may have multiple operations with the same virtual destination register as long as these operations are in mutually exclusive basic blocks or separated by (possibly implicit) remap operations. In this form, a program has no anti-or output dependences as a result of register usage.

Uniformization

Uniformization is a process of converting a loop body into a dynamic single assignment form. Each datum that is computed in one iteration and used on a subsequent iteration is assigned to an element of a uniformized array. This is done with two objectives in mind. One is to eliminate anti- and output dependences, thereby increasing the amount of parallelism present in the loop nest. The second objective of uniformization is to facilitate the reduction of the number of accesses (e.g., loads and stores) between local storage of a processor element and global memory. A variable converted in this process is referred to as a "uniformized variable."

Dependence Graph

A data structure that represents data flow dependences among operations in a program, such as the body of a loop. In a dependence graph, each operation is represented by a vertex in the graph and each dependence is represented by a directed edge to an operation from the operation upon which it is dependent. The distance of a dependence is the number of iterations separating the two operations involved. A dependence with a distance of 0 connects operations in the same iteration, a dependence from an operation in one iteration to an operation in the next one has a distance of 1, and so on. Each dependence edge is also decorated with an edge delay that specifies the minimum number of cycles necessary, between the initiation of the predecessor operation and the initiation of the successor operation, in order to satisfy the dependence.

A loop contains a recurrence if an operation in one iteration of the loop has a direct or indirect dependence upon the same operation from a previous iteration. The existence of a recurrence manifests itself as one or more elementary circuits in the dependence graph. (An elementary circuit in a graph is a path through the graph which starts and ends at the same vertex and which does not visit any vertex on the circuit more than once.) Necessarily, in the chain of dependences between an operation in one iteration and the same operation of a subsequent iteration, one or more dependences must be between operations that are in different iterations and have a distance greater than 0.

Predication

Predicated execution is an architectural feature that relates to the control flow in a computer program. In a computer architecture that supports predicates, each operation has an additional input that is used to guard the execution of the operation. If the predicate input is True, then the operation executes normally; otherwise the operation is "nullified", that is, has no effect on the processor state. Consider for example the operation:

r=a+b if

The operation has the p as the predicate input. If p is true, the operation computes a+b and writes the result into register r. On the other hand, if p is False, then the operation does not store a new value into r.

Predicated execution simplifies the generation of control hardware as it can be used to eliminate branches from programs. Branches imply a synchronized, global control of all of the functional units in that the functional units must be re-directed to perform new operations. Predicated execution, on the other hand, distributes control to each operation, and thus, the control can be implemented efficiently in hardware. Also, since predicate inputs are like other data inputs, code transformations that are used for data, such as arithmetic re-association to reduce height, can be used for predicates.

Throughput

Throughput is a measure of processor performance that specifies the number of times a certain computation, such as an iteration of the loop body, is performed per unit time.

Initiation Interval

A measure of processor performance, and the reciprocal of throughput, that specifies the number of processor cycles between the initiation of successive iterations of the loop body.

Memory Bandwidth

Memory bandwidth is a measure of performance that specifies the quantity of data per unit of time that that can be transferred to and from a memory device.

Minimum Initiation Interval (MII)

A lower bound on the initiation interval for the loop body when modulo scheduled on the processor element. The MII is equal to the larger of the RecMII and ResMII.

Resource-Constrained MII (ResMII)

A lower bound on the MII that is derived from the resource usage requirements of the loop body (e.g, the functional units required to execute the operations of the loop body).

Recurrence-Constrained MII (RecMII)

A lower bound on the MII that is derived from latency calculations around elementary circuits in the dependence graph for the loop body.

Operation Set

An operation set is a set of opcodes that are mutually exclusive or cannot be issued concurrently. The ability to represent opcodes in an operation set is only a convenience and is not required to implement the system. While each operation set can consist of a single opcode, it is more convenient to specify opcodes with similar properties as a set. This approach simplifies the input specification because the user (or another program module) need only specify desired concurrency and/or exclusion relationships among sets of operations, as opposed to each individual operation. Though not required, the opcodes in an operation set may share similar properties, such as latency and data type. For example, integer arithmetic operations such as ADD and SUBTRACT might be organized in an operation set. In the description that follows, we use the notation, ops( ) to represent an operation set in textual form.

Operation Group

An operation group is an instance of an operation set. Operation groups make it possible to specify that multiple instances of the same operation be issued concurrently. For example, one may want a processor to be able to execute three integer ADD operations concurrently. Thus, the designer could specify that the input specification will include three operation groups, A, B, C, each representing an instance of the operation set, ops(ADD SUB).

Operation Group Occurrence

An operation group occurrence is an occurrence of an operation group in a particular concurrency set or exclusion set. The operation group occurrence enables the processor designer to identify concurrency or exclusion relationships among operation groups explicitly in the input specification. For example, consider an operation group A that is an instance of the operation set ops(ADD SUB). This operation group may be issued concurrently with many different combinations of other operation groups. In order to specify these concurrency relationships, the input specification allows a different "occurrence" (e.g., $A_1$, $A_2$, etc.) of the same operation group to be member of each of these concurrency sets.

Concurrency Set

A concurrency set is a set of operation group occurrences that may be issued concurrently.

Exclusion Set

An exclusion set is a set of operation group occurrences that are mutually disjoint. In other words, the exclusion set specifies a set of operation groups, each having operations that cannot be executed concurrently with any of the operations in each of the other groups in the exclusion set.

Abstract Instruction Set Architecture Specification

An Abstract Instruction Set Architecture (ISA) Specification is an abstract specification of a processor design and may include the following:

- an opcode repertoire, possibly structured as operation sets;
- a specification of the I/O format for each opcode;
- a register file specification, including register files and specifying their types and the number of registers in each file;
- a specification of the desired ILP constraints, making use of some form of concurrency sets, exclusion sets or a combination of concurrency and exclusion sets, that specifies which sets of operation groups/opcodes can be issued concurrently; and
- other optional architecture parameters, e.g., presence/absence of predication, speculation, etc.

There are a variety of ways to represent the ILP constraints. The user (or another program module) may specify the desired ILP by specifying exclusion and concurrency relationships among operation group occurrences. One way to specify exclusion and concurrency relationships is to construct a data structure representing AND-OR relationships among operation group instances, such as a multi-level AND-OR tree. In such a structure, an AND relationship represents a concurrency relationship among operation group occurrences. Conversely, an OR relationship represents an exclusion relationship among operation group occurrences. Another way to specify exclusion and concurrency relationships is through a graph data structure where the nodes represent operation group occurrences, for example, and the edges connecting the nodes represent exclusion or concurrency relationships among the nodes. Yet another way is to specify pairwise exclusions between operation group occurrences. It is important to note that our approach of organizing operations into operation sets, operation groups, and operation group occurrences is just one way to facilitate expression of ILP constraints. Other ways to organize operations and to express ILP constraints among these operations may be used as well.

Instruction Format Specification

The instruction format specifies the instructions capable of being executed in a VLIW processor design. These instructions are represented as instruction templates in the current implementation. The instruction format also includes the instruction fields within each template, and the bit positions and encodings for the instruction fields.

Concrete ISA Specification

The concrete ISA specification includes the instruction format specification and a register file specification of a processor design. The register file specification enumerates the processor's register files, the number of registers in each file, and a correspondence between operand instruction field and register file.

Macrocell Library (also referred to as Macrocell Database)

A macrocell library is a collection of hardware components specified in a hardware description language. It includes components such as gates, multiplexors (MUXes), registers, etc. It also includes higher level components such as ALUs, multipliers, register files, instruction sequencers, etc. Finally, it includes associated information used for synthesizing hardware components, such as a pointer to a synthesizable VHDL/Verilog code corresponding to the component, and information for extracting a machine description (MDES) from the functional unit components.

In the current implementation, the components reside in a macrocell database in the form of Architecture Intermediate Representation (AIR) stubs. During the design process, various synthesis program modules instantiate hardware components from the AIR stubs in the database. The MDES and the corresponding information in the functional unit component (called mini-MDES) are in the form of a database language called HMDES Version 2 that organizes information into a set of interrelated tables called sections containing rows of records called entries, each of which contain zero or more columns of property values called fields. For more information on this language, see John C. Gyllenhaal, Wen-mei W. Hwu, and Bantwal Ramakrishna Rau. HMDES version 2.0 specification. Technical Report IMPACT-96-3, University of Illinois at Urbana-Champaign, 1996.

Architecture Intermediate Representation

The Architecture Intermediate Representation (AIR) is a hardware description representation in a machine-readable form. The form of AIR used in the automated control path design is similar to VHDL, but is implemented in a computer language that makes hardware components described in AIR format easier to manipulate with the program routines.

AIR provides a number of $C^{++}$ classes that represent hardware components such as registers, ports and wiring. An AIR design consists of objects instantiated from these classes. For example, an AIR representation of the control path may include a number of macrocell objects representing hardware components such as a register, a FIFO buffer, multiplexor, a tri-state buffer, and wiring. Each of the macrocells may have a number of control and data ports in AIR format and may be interconnected via an AIR wiring data structure.

Data Path Specification

The data path specification is a data structure specifying functional units, registers/register files and interconnections between the data ports of the functional units and registers/register files. The data path may also specify control ports, such as the opcode inputs of the functional units and the register file address inputs.

In the implementation, the data path specification is a set of related object instantiations in AIR format, enumerating the macrocell instances of functional units and their interconnect components, such as multiplexors, tri-state buffers, buses, etc.

Instruction Unit

The instruction unit includes a control path and an instruction sequencer macrocell. The control path has three principal components: 1) the data path of an instruction from the program memory or instruction cache to the instruction register (IR) (the IUdatapath), 2) the control logic for controlling the IUdatapath, and 3) the instruction decode logic for decoding each instruction.

In our control path schema for a programmable processor, the IUdatapath starts at the instruction cache or program memory and ends at an instruction register that interfaces with the instruction decode logic. It includes instruction prefetch buffers and an instruction alignment network for aligning the instruction in the instruction register. Connected between the sequencer and IUdatapath, the IU control logic is combinational logic used to control the instruction prefetch buffers, and the alignment network.

Instruction Sequencer

The instruction sequencer is the control logic that interfaces with the control logic of the IUdatapath and specifies the sequence of instructions to be fetched from the instruction cache or program memory. It manages a memory address register (MAR) that holds the memory address of the next instruction to be fetched from the instruction cache, and the Program Counter, identifying the next instruction to be executed in the processor. The control ports of the sequencer interface with the control ports of the IUdatapath control logic. The sequencer is also responsible for interfacing with the branch functional unit and for managing events such as interrupts and exceptions. The sequencer is a generic macrocell, not a custom design.

3.0 Overview of the Design Flow

FIG. 1 provides a conceptual overview of our implementation of a processor array design flow process. The design flow process transforms the program code of a sequential loop nest from using a single address space (e.g., main memory) 100 to multiple address spaces (e.g., local memory, look up tables, FIFOs, ROM, and main memory) 102. The initial sequential code contains references to a global address space implemented in main memory of the computer. The transformed code includes parallel processes that reference a local address space implemented in a local storage and that also occasionally references the global address space (e.g., in main memory). The purpose of this stage in the design flow is to minimize the use of local storage within the available main memory bandwidth.

The design flow process transforms the sequential computation of the nested loop into a parallel computation 104. This stage applies various parallel compiler methods to map the nested loop code from its original iteration space to a time-processor space.

Additionally, the design flow process maps the parallel computation to the specified number of processors. In the implementation detailed below, this mapping yields a synchronized parallel computation on an array of physical processor elements.

The design flow process transforms the parallel computation assigned to each processor into a single, non-nested loop to yield a synchronized parallel program. At this stage, a single time loop is assigned to each physical processor element. The design flow has transformed the loop nest into a form that enables a hardware synthesis process 106 to convert this collection of single time loops to a hardware structure representing the physical processor array.

FIG. 1 depicts a specific example of this processor array. In this example, the processor array comprises an array 108 of data path elements 110. Typically controlled by a general-purpose computer, the array receives control signals via a co-processor interface 112 and array controller 114. When it receives a command to start executing a loop nest and is initialized, the processor array executes the loop nest and returns a signal indicating it is done.

Figure 2:
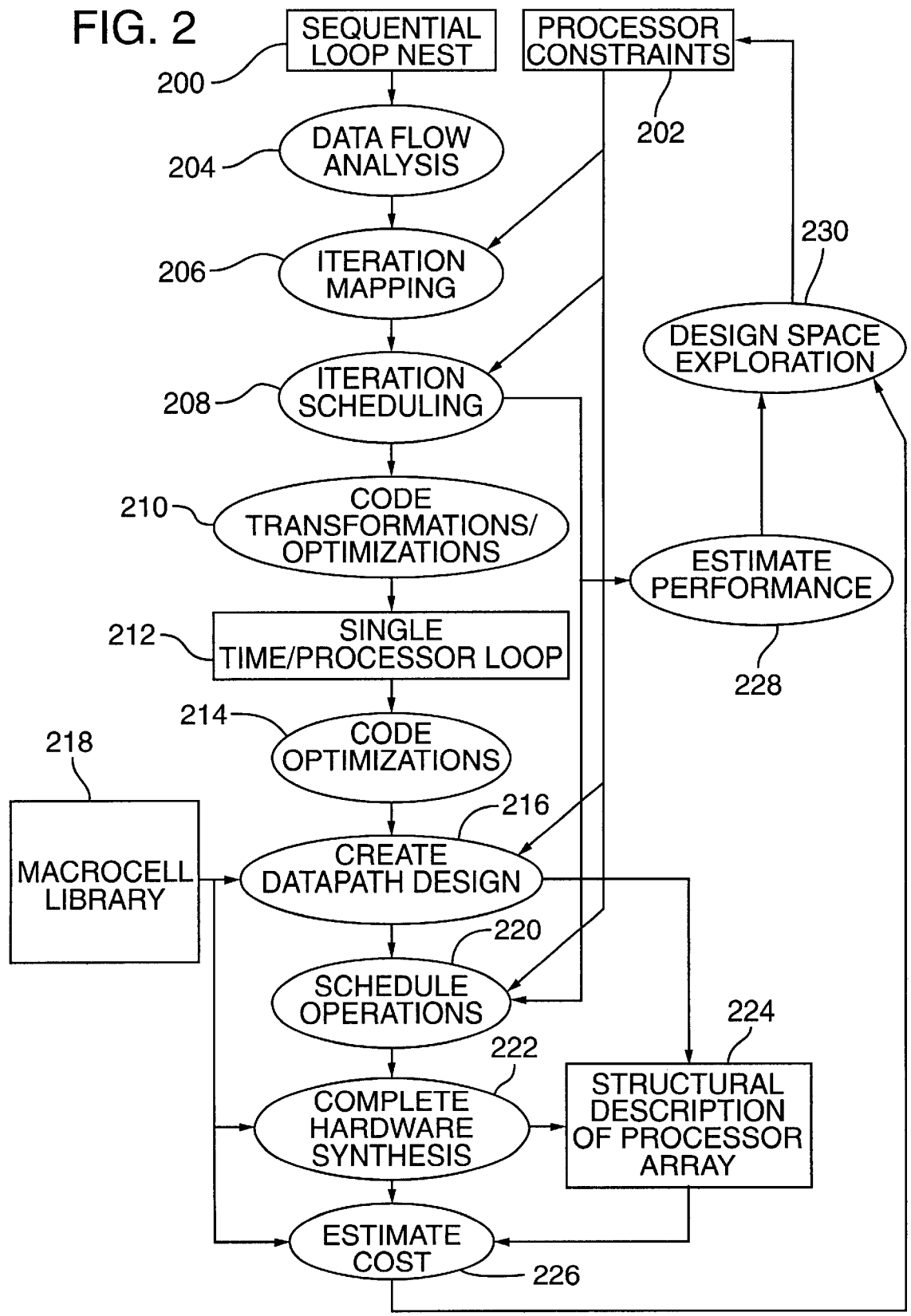
FIG. 2 is a flow diagram illustrating the operation of a system that implements the design flow of FIG. 1.

Shown in more detail in FIG. 2, the design flow has two primary parts: a front end that transforms a nested sequential loop 200 into a time-processor loop for synthesis into a processor array that satisfies specified processor constraints 202; and a back end that synthesizes the time—processor loop into the processor array.

3.1 The Front End Process

The front end performs data flow analysis to construct a data flow graph and extract variable references (204). Next, it maps iterations of the nested loop to processor elements based on a desired processor topology (206). Using this mapping, the processor constraints and data dependence constraints, the front end performs iteration scheduling to determine a start time for each iteration that avoids resource conflicts (208). Finally, the front end transforms the code from its initial iteration space to a time—processor space 210, 212. The output specifies a single time loop for each processor element. To exploit parallelism of the array, the single time loops are scheduled to execute concurrently in the processor elements of the array.

3.2 The Back End Process

The back end process takes the loop body of the single time loop and processor constraints as input and synthesizes a processor element. It also synthesizes the interconnect between processor elements as well as the interface between the processor array and a host.

The back end process begins by preparing the loop for synthesis (214). This stage uses various compiler methods designed to exploit ILP. Significantly, these techniques are employed before the underlying hardware being designed is fixed.

Examples of ILP compiler methods applied to the loop body include: If-conversion using predicates, copy propagation, and dead code elimination. Other methods that may be used in connection with front end and back end code analysis include, but are not limited to: speculative code motion, critical path reduction, loop invariant removal, constant propagation and folding, strength reduction, common sub-expression elimination, etc.

After preparing the loop, the back end process allocates functional units for the datapath and creates a temporary interconnect (216). In the process of allocating the functional units, the back end process examines the operations in the loop body and selects functional units from a macrocell library 218 so as to minimize cost while achieving desired performance and initiation interval constraints. The temporary interconnect assumes an arbitrary number of registers and full connectivity between functional units and registers.

Next, the back end synthesis schedules the operations in a single loop iteration on the partially designed processor 220.

After scheduling, the back end process completes the hardware synthesis of the local storage and the interconnect between local storage and the functional units (222). The back end process may also create an interface between a host processor and the processor array. The design of this interface depends in part on the control protocol selected for the processor array. For example, in the implementation detailed below, the processor array uses a distributed control model, where each array element has its own control logic based on predication code generated in the front end. Finally, the back end process synthesizes the control code that invokes the processor array the appropriate number of times.

The back end produces a structural representation of the processor array 224. From this representation and cost information (e.g., a cost model, chip area, gate count) obtained from the macrocell library, the back end estimates the cost of the design (226). The system also estimates performance based on the iteration schedule and the operation schedule (228). The cost and performance estimates may then be used to adjust the processor constraints 202 as part of a programmatic design space exploration process. In such a process, a design space exploration program programmatically specifies and evaluates alternative designs, typically based on the cost/performance of designs that it evaluated previously, to find a design or set of designs that meets desired cost/performance criteria (230).

For more information on design space exploration in the context of processor system design, see U.S. patent application Ser. No. 09/378,290, entitled, "AUTOMATED DESIGN OF PROCESSOR SYSTEMS USING FEEDBACK FROM INTERNAL MEASUREMENTS OF CANDIDATE SYSTEMS" by Michael S. Schlansker, Vinod Kumar Kathail, Greg Snider, Shail Aditya Gupta, Scott A. Mahlke and Santosh G. Abraham, which is incorporated by reference.

3.3 Summary of Implementation

The design flow illustrated in FIGS. 1 to 2 is implemented in a collection of program modules that together form a programmatic processor array design system. The system takes a loop nest in a high level programming language such as C and generates a structural description of a processor array in VHDL that can execute the loop nest while satisfying specified performance and processor constraints. Examples of the performance constraints include the execution time (e.g., schedule length), and the throughput of the processor array. The processor constraints include the number of processors in the array, the topology in which they are connected together, and the available memory bandwidth.

The system is implemented in collection of program modules written in the C++ programming language. While the system may be ported to a variety of computer architectures, the current implementation executes on a PA-RISC workstation or server running under the HP-UX 10.20 operating system. The system and its components and functions are sometimes referred to as being "programmatic." The term "programmatic" refers to a process that is performed by a program implemented in software executed on a computer, in hardwired circuits, or a combination of software and hardware. In the current implementation, the programs as well as the input and output data structures are implemented in software stored on the workstation's memory system. The programs and data structures may be implemented using standard programming languages, and ported to a variety of computer systems having differing processor and memory architectures. In general, these memory architectures are referred to as computer readable media.

The system constructs the processor array by selecting structural components from a macrocell database. This database includes a mini-MDES associated with functional unit macrocells that specify the opcodes executed on the functional unit, their input/output format, latencies and internal resource sharing constraints. The resulting structural description is specified in VHDL. Along with the structural description, the system evaluates the cost of the design in terms of die area, number of gates required to implement the processor array, and power consumption.

The programmatic processor array design system generates a structural description of a synchronous processor array tailored to execute the high level loop nest. This array consists of nearly identical processor elements. These elements are "nearly identical" in that the boundary processors may be different than interior processors. In some cases, "dead" hardware may be removed from some processor elements (e.g., hardware synthesized from code dependent on a predicate that is always false).

The processor elements are connected in a one or two dimensional grid. The size and dimensionality of this array is referred to as its topology. In general, each processor can be connected to a set of neighboring processors. Preferably, the design system should ensure that the time taken to go from one processor to its neighbor is bounded by an upper bound, which may be one of the parameters that is specified at design time. The processors that can be reached in the specified time are referred to as neighbors.

Each processor element typically contains a certain amount of local storage, which may be organized as registers, register files, or local memories. Similarly, the processor array may have storage local to the array, which is organized as local memory (e.g., RAM). These local memories can be used to reduce the bandwidth between the processor array and global memory.

Each of the processor elements execute nearly the same program. Again, some of the boundary processors may execute code that is slightly different from the code executed by the interior processors.

The processor array is referred to as being synchronous in that each of the processor elements execute their respective parallel processes in lock step. On each cycle, each processor element executes the same instruction, and if one needs to stall, then all do. As a result, any needed synchronization can be guaranteed at the time that the array is designed.

4.0 Front End Components and Methodology

Figure 3:
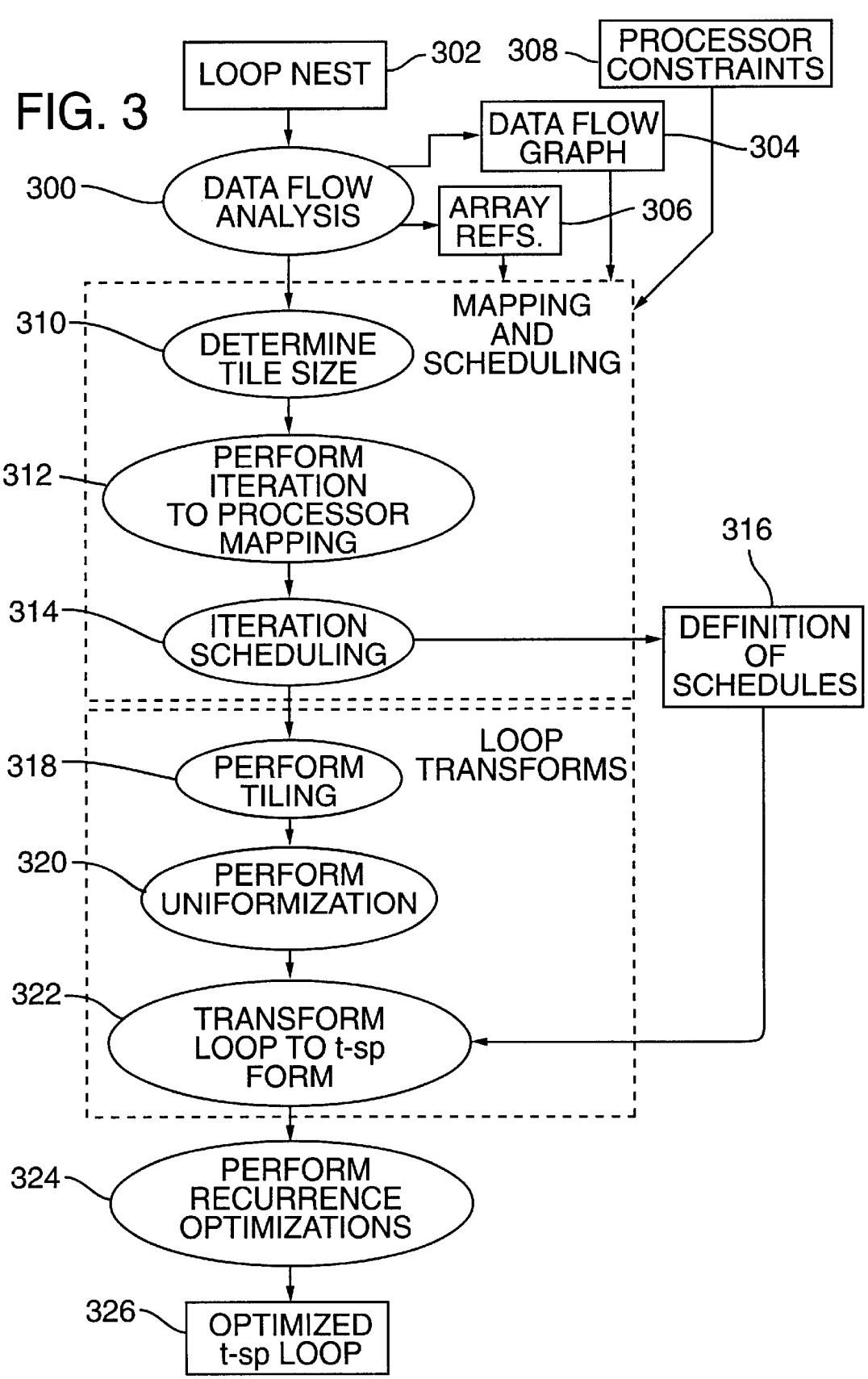
FIG. 3 is a flow diagram of a process for transforming a nested loop into a two-dimensional loop over time and processor elements.

FIG. 3 is a flow diagram illustrating an implementation of the front end. Each of the components in the front end is described in sub-sections 4.1 to 4.3.

To illustrate the process of transforming a loop nest into a single time loop per processor element, it is helpful to consider a running example. The following sections explain this process using the following loop nest as an example.

```
int i, j, n1, n2
/* The actual data arrays in memory */
float x[n1], w[n2], y[n1-n2+1];
/* Loop Nest */
for (i=0; i≦n1-n2, i++) {
    for (j=0; j<n2; j++)
    y[i]=y[i]+w[j]*x[i+j];
}
```

The above code example is a Finite Impulse Response Filter (FIR). The nested loop has the following characteristics: there is no code, except the statements in the innermost loop body, and there is no procedure call in the inner loop. Exact value flow dependence analysis is feasible for this loop as there are no pointer de-references or non-affine loop indices.

4.1 Data Flow Analysis

The data flow analysis phase (300) takes a high level program (e.g., written in C), including one or more nested loops(302), identifies the nested loop or loops to be transformed into a synchronous processor array, and performs a data dependence analysis on each loop nest. The term "synchronous" in this context means that the processor elements share a common clock. Since the analysis is similar for each loop nest, the remaining discussion assumes a single nested loop.

4.1.1 Creating the Dependence Graph

The data dependence analysis creates a data flow graph (DFG)(304) for the loop nest. This graph is an internal data structure representing the data dependences among operations in the loop body, and dependences between operations in different iterations of the loop body.

Figure 4:
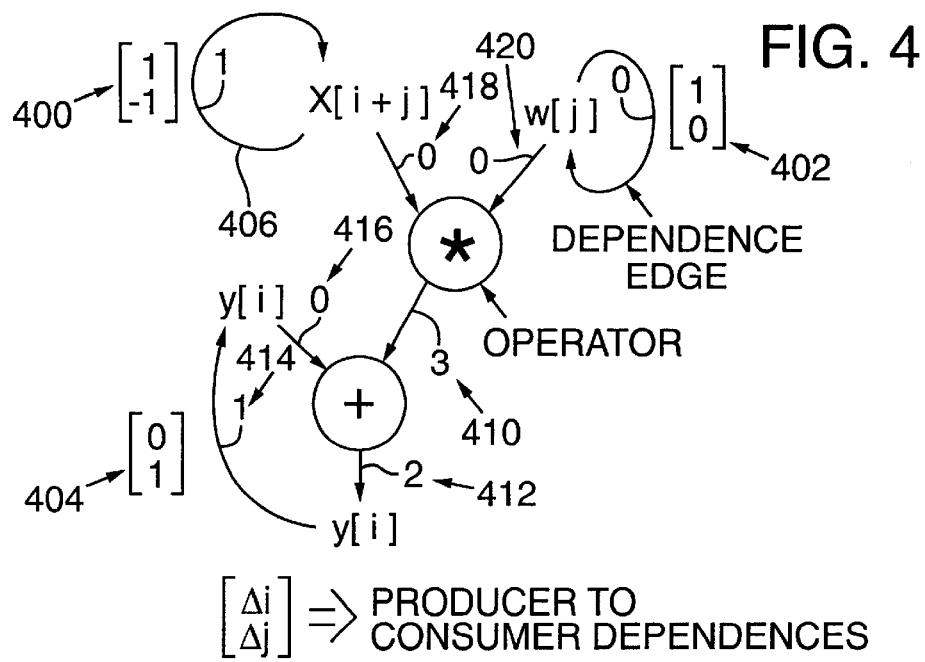
FIG. 4 is an example of a data flow graph for the loop body of a finite impulse response filter, annotated with data dependence information.

FIG. 4 shows an example of the DFG for the example above. The graph records dependences between operations in the loop body. It also records dependences between iterations: read operations consuming input from another iteration, and write operations producing output to another iteration.

The edges of the DFG are annotated with dependence distances and latencies. A dependence distance is an integer vector of size n giving the difference between the iteration indices of an operation that produces a value and the iteration indices of the iteration that uses the value. For data values that are used at many iterations, we introduce a DFG self-loop annotated by the distance between nearby iterations that use the same value (e.g., 406, FIG. 4).

Edges are also annotated with operation latencies as explained in the next section.

4.1.2 Extracting Latency Information

An operation latency refers to the time in cycles between sampling an input of an operation and producing a result available for a subsequent operation. In the implementation, the data flow analysis phase extracts latency information from a database containing a machine description (MDES) that stores latencies for various operations in a given architecture.

The DFG shown in FIG. 4 is annotated with latency information. In this example, the latency of a multiply operation is three cycles (410), and the latency of an add operation is two cycles (412). The latency of these operations is dependent on the particular functional units that will implement them in the processor data path. The data flow analysis phase identifies the operations in the DFG and looks up the corresponding latency of these operations in the MDES section of a macrocell database. As shown in FIG. 4, the data flow analysis phase also assigns a latency to edges in the DFG that represent the latency of communicating an array element from one processor element to another (414–420). This information is added to the data flow graph after mapping iterations to processor elements.

In addition to the data flow graph, another output is a file of array references (FIG. 3, 306) in the loop body. This file contains one record per array indicating how the array is accessed. As explained below, this information is used to estimate the number of array elements read or written by a set of iterations.

Several data flow programs may be used to implement this stage. The current implementation uses a program called Omega from the University of Maryland.

4.2 Preparation of Transformation Parameters

Before the front end transforms the code, it determines a mapping of iterations to processor elements and an iteration schedule. In general, the iterations in an n-deep loop nest are identified by the corresponding integer n-vector of loop indices in the iteration space. The mapping of iterations to processor elements identifies a corresponding processor element in an (n−1) dimensional grid of processor elements for each of the iterations of the nested loop.

As a practical matter, the iteration mapping will not match the desired topology of a physical processor array. As such, the implementation views the mapping of iterations to an (n−1) dimensional array of processor elements as a mapping to virtual processors. It then assigns virtual processors to physical processor elements.

The front end determines an iteration mapping and iteration schedule based on processor constraints (308) provided as input. These constraints include the desired performance (e.g., an initiation interval), a memory bandwidth constraint, and a physical processor topology specified as a one or two dimensional processor array.

The implementation uses tiling to reduce local storage requirements of each physical processor element. It also employs clustering to map virtual processors to physical processors. While tiling is not required, it is useful for many practical applications. Tiling constrains the size of the iteration space and thus reduces local storage requirements. However, when the tile size is reduced, the memory bandwidth between local and global memory tends to increase. As the tile size shrinks, there are fewer iterations per tile and the ratio of iterations at the boundary of the tile relative to other iterations in the tile increases. Each local processor, therefore, benefits less from the re-use of intermediate results in the tile.

4.2.1 Determining the Tile Size

Figure 5:
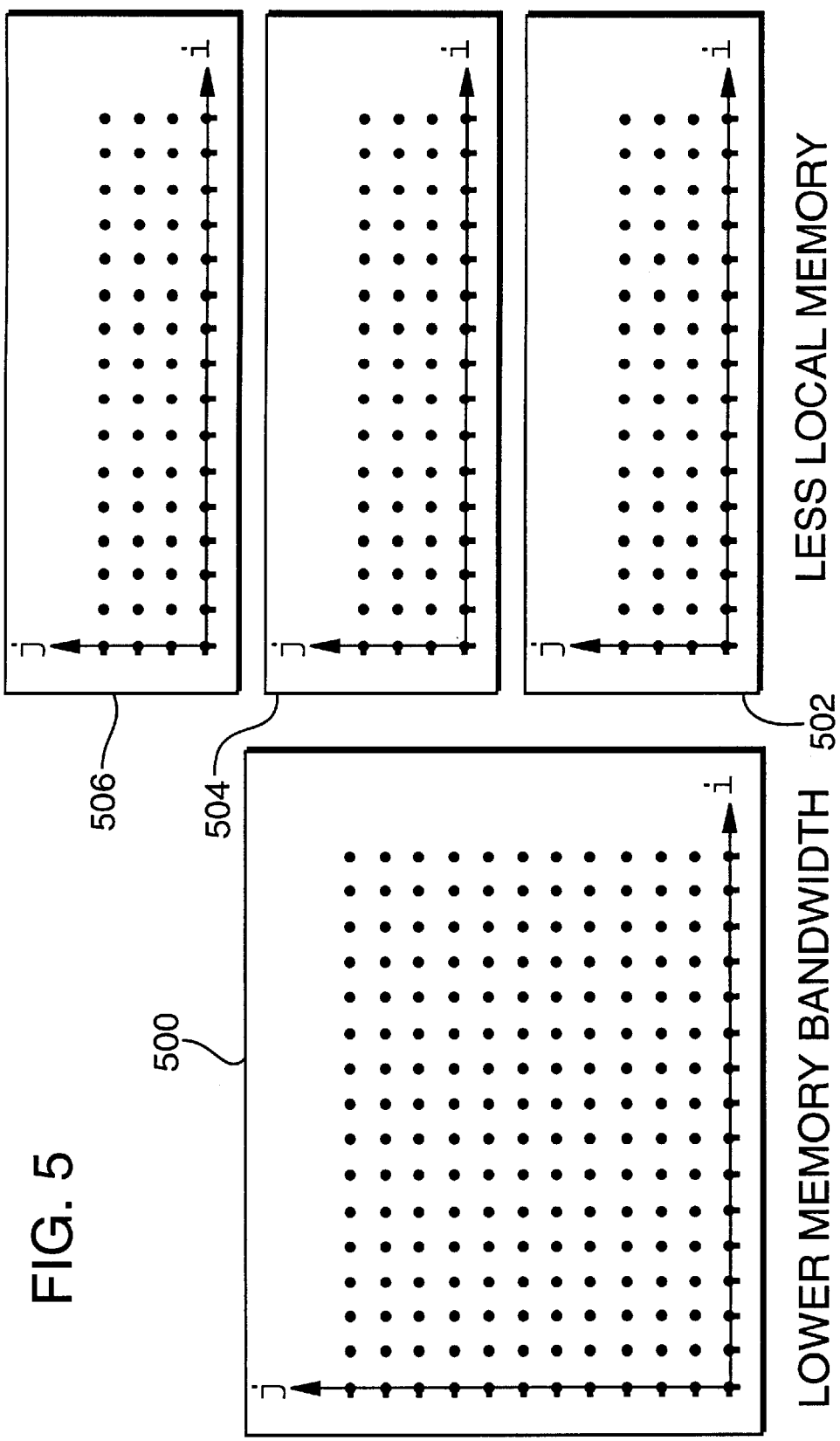
FIG. 5 is diagram illustrating the process of tiling an iteration space of a nested loop to partition the loop into sets of iterations initiated sequentially.

The process of tiling partitions the iterations of the nested loop into tiles of iterations that are capable of being initiated and completed sequentially. FIG. 5 shows a conceptual example of tiling a two-dimensional iteration space with iteration coordinates (i, j) into three tiles. In this example, the tiler has partitioned the iteration space (500) into three tiles (502, 504, 506) along the j dimension.

From the example, one can see that the ratio of iterations at the tile boundary to the other iterations in the tile increases when the tile size decreases. Thus, tiling is likely to increase memory bandwidth requirements because of the transfers between main memory and local storage that typically occur at tile boundaries.

The front end programmatically determines the tile size (310) using the processor constraints (308) and the array references extracted in the data flow analysis. It treats the process of determining a tile size as a constrained minimization problem. It picks a tile shape (i.e., the dimensions of the tile) so that the number of iterations in the tile is minimized while satisfying the constraint of a specified main memory bandwidth. The specified memory bandwidth is provided as input to the front end as one of the processor constraints. To determine whether a selected tile shape satisfies the bandwidth constraint, the front end estimates the bandwidth using the following expression:

Estimated bandwidth=(Estimated Traffic/Estimated Cycle Count)

The front end estimates the traffic (i.e. the estimated transfers to and from main memory) based on the dimensions of the tile and the array references of the iterations in the tile. It estimates cycle count based on the number of iterations in the tile, a specified initiation interval, and the number of processors.

The estimated cycle count is expressed as:

Estimated Cycle Count=(Iterations per tile*initiation interval)/number of processors)

(The units of the initiation interval are processor cycles per iteration. The units of the estimated cycle count are cycles.)

A variety of cost minimization algorithms may be used to solve this constrained minimization problem, such as simulated annealing or hill climbing.

In some cases, the tile size chosen by the tile size routine may cause the iteration scheduling program module process to generate a set of schedules that does not satisfy the dependence constraints of the nested loop. In this case, the front end expands the tile size and generates a new set of schedules. The selection of the tile size is complete when the set of schedules includes one or more schedules that satisfy the dependence constraints. The form of these constraints is described further below.

4.2.2 Determining an Iteration to Processor Mapping

Next, the front end determines a mapping of iterations to processor elements (312). As introduced above, the mapping assigns iterations of the nested loop to virtual processors. This mapping produces an (n−1) dimensional grid of virtual processors, each having a set of iterations. The front-end assumes that the mapping is a linear projection of the iterations in the iteration space in a chosen direction called the "null direction." Each virtual processor is assigned a set of iterations that lie along a straight line in the null direction.

Conceptually, the mapping satisfies the following expression:

$$\Pi \vec{u} = 0,$$

where Π is an (n−1) by n matrix and $\vec{u}$ is the null vector.

Figure 6:
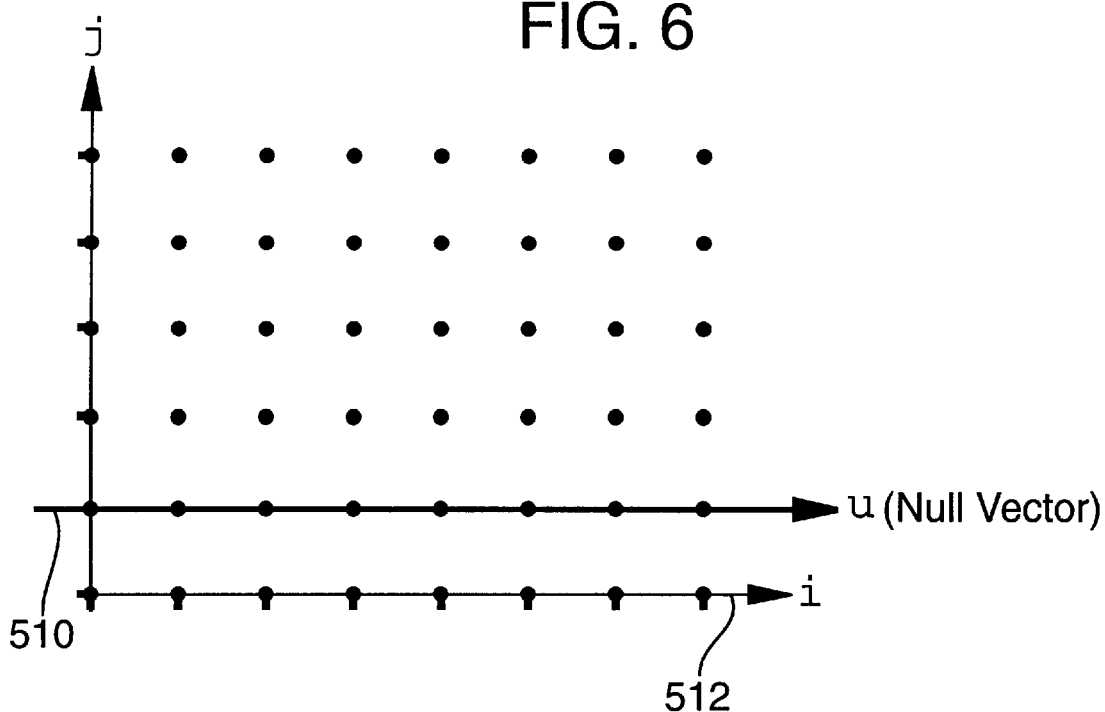
FIG. 6 is diagram illustrating a null vector superimposed on an iteration space. In this example, the null vector is parallel to one of the dimensions of the iteration space.

For a given vector $\vec{u}$, there are infinitely many mappings that satisfy this expression. However, as a practical matter, there are certain choices that are more straight-forward to implement. In the implementation, the null direction is selected to be parallel to one of the iteration coordinates. FIG. 6 illustrates an example where the null vector (510), shown superimposed on the iterations space, is parallel to the i coordinate dimension (512) of a two-dimensional (i, j) iteration space.

Given the null direction parallel to one of the iteration coordinates, the implementation chooses a mapping such that the virtual processors correspond to the remaining (n−1) dimensions in the iteration space. Thus, Π is chosen to consist of n−1 rows of the identity matrix.

As explained later, it is not necessary to choose a null direction parallel to one of the iteration space coordinates. The iteration scheduling technique described below, for example, applies to other linear mappings of the iteration space in a null direction that is not parallel to one of the iteration space coordinates.

While the implementation obtains a mapping of iterations based on a user-specified null direction, it is also possible to select a null direction and mapping programmatically. The user may provide a null vector and allow the system to select a mapping matrix. Conversely, the user may provide a mapping matrix and allow the system to derive the null direction (the mapping matrix determines the null vector uniquely). Finally, the system may select a null direction and a mapping matrix programmatically.

As noted above, the implementation assigns clusters of virtual processors to physical processor elements. In order to schedule iterations on physical processors, the front end uses the cluster shape as an input. The user specifies the topology of the physical processor array. The front end defines the cluster shape as:

$$\vec{C} = \lceil \vec{V} | \vec{P} \rceil$$

where $\vec{C}$ is the cluster shape, $\vec{V}$ is the shape of the virtual processor space, and $\vec{P}$ is the shape of the physical processor array. There are a number of possible choices for associating axes of the virtual processor space with axes of the physical processor space. Section 4.2.3 describes one way to optimize the selection.

4.2.2 Iteration Scheduling

After determining an iteration to processor mapping, the front end performs iteration scheduling (314) to compute a definition of schedules compatible with the specified processor constraints (308).

Figure 7:
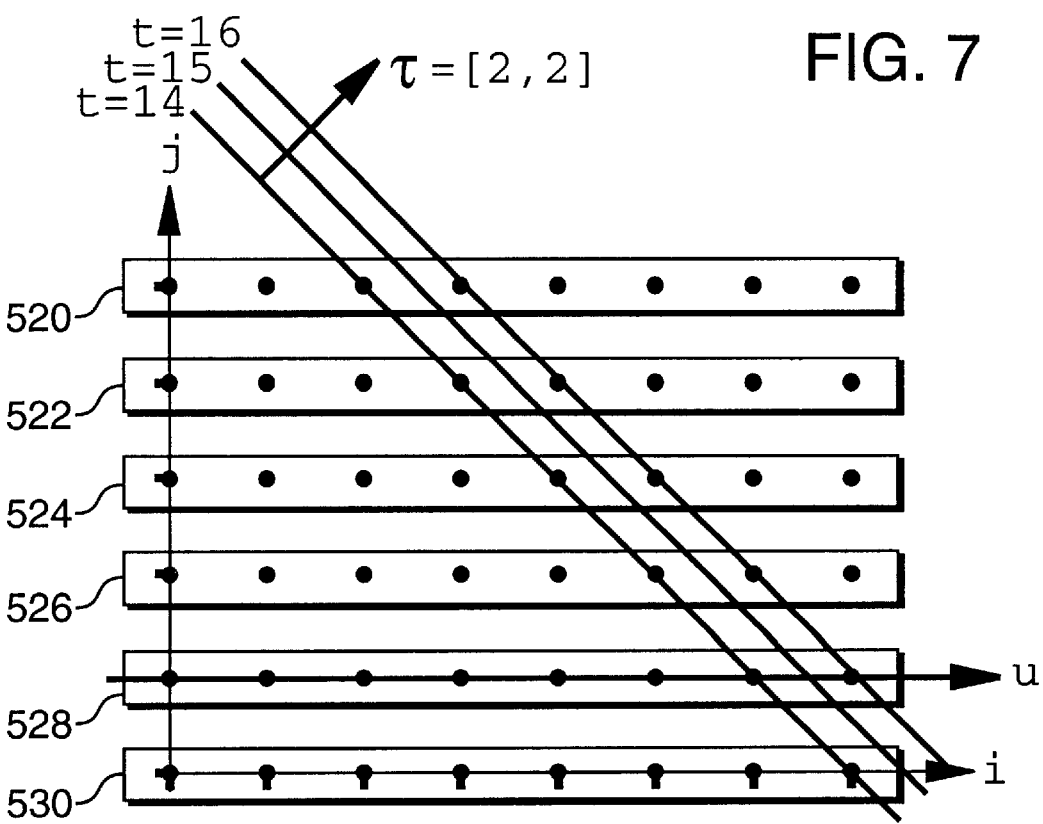
FIG. 7 is a diagram showing an example of scheduling iterations that are mapped to virtual processors. The points in the grid correspond to iterations in the iteration space and the horizontal boxes represent virtual processors.

FIG. 7 illustrates the concept of iteration scheduling of virtual processors. In this phase, an iteration scheduler finds a start time for each iteration to satisfy certain constraints, e.g., the data dependences in the nested loop. In this example, the virtual processors are represented as horizontal boxes (520–530), each containing a set of iterations. The schedule is a vector τ that defines a start time for each iteration.

Figure 8:
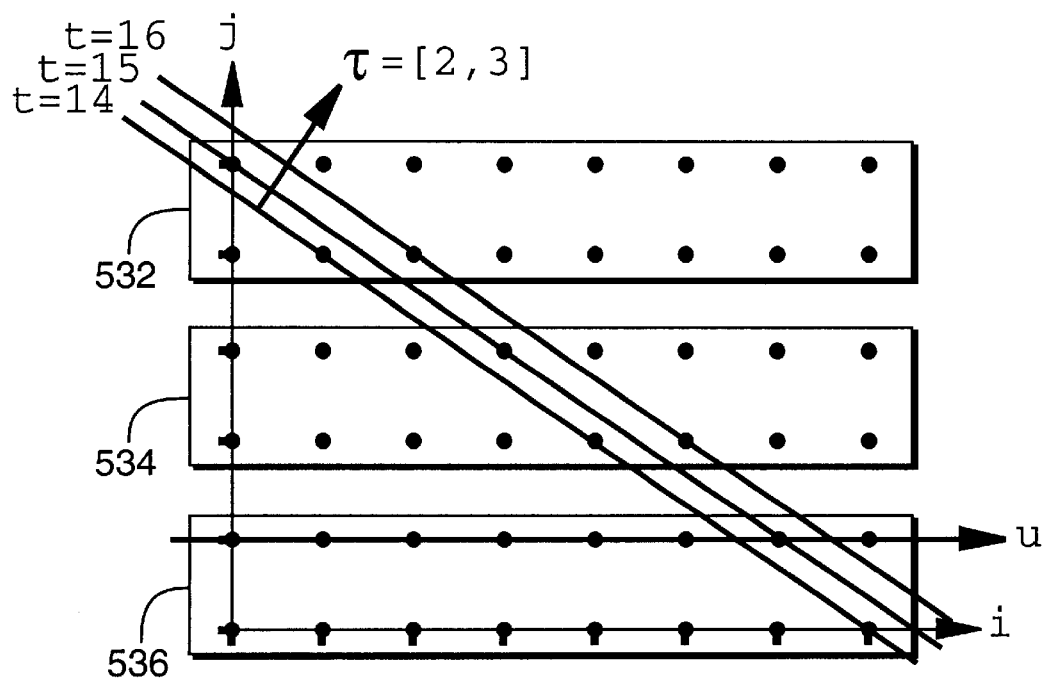
FIG. 8 is a diagram showing an example of scheduling iterations where two virtual processors are assigned to each physical processor element. The horizontal rows correspond to virtual processors, and each of the boxes corresponds to a cluster of virtual processors assigned to a physical processor element.

FIG. 8 alters the example of FIG. 7 by extending it to show iteration scheduling of clustered virtual processors. The horizontal rows correspond to virtual processors, and each of the boxes (532, 534, 536) corresponds to a cluster of virtual processors assigned to a physical processor element. Each start time in the iteration schedule is depicted as a line through the iteration space. The points intersecting each time line are the iterations that begin execution at that time. Due to resource sharing conflicts, it is not possible to schedule two iterations to start at the same time on the same processor. More specifically, the iteration scheduler ensures that only one iteration starts on a processor per initiation interval.

The iteration scheduler in the front end generates a definition of tight schedules for a given mapping of iterations to processor elements. A tight schedule is one that provides a start time for each iteration on a processor element such that no more than one iteration is started on a processor element for each initiation interval, and after some initial period, exactly one is scheduled for each initiation interval. If the initiation interval is one cycle, for example, then one and only one iteration starts executing on each processor element per cycle.

Given a cluster shape and a mapping of iterations to processor elements in a null direction parallel to one of the iteration coordinates, the iteration scheduler produces a definition of tight schedules:

$$\vec{\tau} = (k_1, k_2 C_1, \ldots, k_n C_1 \ldots C_{n-1}) \qquad (1)$$

where $C=(C_1, \ldots, C_{n-1})$ is a vector giving the shape of the cluster of virtual processors assigned to each physical processor and $\vec{k}=(k_1, \ldots k_{n-1})$ is a vector of integers that has the property that the greatest common denominator of $k_i$ and $C_i$ is one and $k_n = \pm 1$. A preliminary permutation of the axes of the cluster may be applied (e.g., when n=3, $\vec{\tau}=(k_1, k_2 C_1, k_3 C_1 C_2)$ or $\vec{\tau}=(k_1 C_2, k_2, k_3 C_1 C_2)$). As such, schedules where such a preliminary permutation is applied should be deemed equivalent.

The start time of each iteration is the dot product of $\vec{\tau}$ and the iteration coordinates of the iteration:

$$t(\vec{j}) = k_1 j_1 + k_2 C_1 j_2 + k_3 C_1 C_2 j_3 + \ldots + k_n C_1 \ldots C_{n-1} j_n$$

where $\vec{j}$ is a vector of loop indices.

The null direction need not be in a direction parallel to one of the iteration space coordinates. The above definition may be used to determine a tight schedule for any linear transformation of the iteration space.

To show this concept, let S be the inverse of a unimodular extension of Π. The last column of S is the null vector $\vec{u}$. The remaining columns are the vectors that describe the virtual processor array. In particular, the first (n−1) rows of $S^{-1}$ are the projection matrix Π. The transformation matrix M is the matrix whose first row is $\vec{\tau}$ and whose last (n−1) rows are Π:

$$M \equiv \begin{pmatrix} \vec{\tau} \\ \Pi \end{pmatrix}; \text{thus} \begin{pmatrix} t \\ \vec{v} \end{pmatrix} = M \vec{j}$$

is the mapping from iteration $\vec{j}$ to time t and virtual processor $\vec{v}$. We now change basis in the iteration space: $\vec{j}' = S^{-1} \vec{j}$ are the coordinates of the iteration with respect to the basis consisting of the columns of S. In this basis, the transformation becomes:

$$\begin{pmatrix} t \\ \vec{v} \end{pmatrix} = MS\vec{j}' = \begin{pmatrix} \vec{\tau} \cdot S \\ \Pi S \end{pmatrix} \vec{j}' = \begin{pmatrix} \vec{\tau} \cdot S \\ I_{n-1} 0 \end{pmatrix} \vec{j}'$$

Clearly, $\vec{\tau}$ is a tight schedule with cluster shape $\vec{C}$ and mapping Π if and only it $\vec{\tau} \cdot S$ is a tight schedule for $\vec{C}$ with the mapping $(I_{n-1}0)$. Hence, the generalized condition (1) applied to $\vec{\tau}.S$ is a necessary and sufficient condition for a tight schedule. The formula does not specify the components of $\vec{\tau}$ but rather the components of $\vec{\tau}.S$ and $\vec{\tau}$ is recovered through the integer matrix $S^{-1}$.

In addition to the constraint that the schedule must be tight, the schedule must also satisfy the dependence constraints. These constraints are expressed as a system of linear inequalities of the form:

$$A\vec{\tau} >= b,$$

where A is a matrix of offsets and b is a vector of time intervals.

An example of the linear inequality constraints for the example of the FIR filter and its annotated DFG graph of FIG. 4 is:

$$A = \begin{bmatrix} 1 & 0 \\ 1 & -1 \\ 0 & 1 \end{bmatrix} \quad b = \begin{bmatrix} 0 \\ 1 \\ 3 \end{bmatrix}$$

The entries of the rows in A come from the sums of the distance vectors on the edges of elementary circuits in the dependence graph. The entries of b are from the latencies of macrocells and from the latencies of interprocessor communication.

The top element of b represents the loop on w, the middle element represents the loop on x, and the third element represents the loop on y. The latency for the loop on w is 0 cycles because the value of this array element is available within the processor element. The latency for the loop on x is 1 because the latency of interprocessor communication between adjacent physical processor elements is assumed to be 1 cycle. Finally, the latency for the loop on y is the sum of the latency for an add operation (2 cycles in the example of FIG. 4) and the latency for interprocessor communication (1 cycle).

The implementation of the iteration scheduler employs linear programming to select values of k for use in formula (1) so that the values of $\vec{\tau}$ are likely to satisfy these linear inequality constraints. Starting with the system of linear inequalities from the data flow analysis, the iteration scheduler computes an upper and lower bound on $\vec{\tau}$. These bounds represent the smallest vector box containing the solution to $A\vec{\tau} >= b$. Based on the bounds on $\vec{\tau}$, the iteration scheduler computes bounds on the values of k. With these bounds, the iteration scheduler can then select several values of k that fall within the bounds and then exclude all of the selected values where the greatest common denominator with the corresponding value of C is not equal to 1. This approach provides a direct and efficient programmatic method for selecting several iteration schedules that satisfy the desired constraints.

To illustrate iteration scheduling, it is instructive to look at an example.

Figure 9:
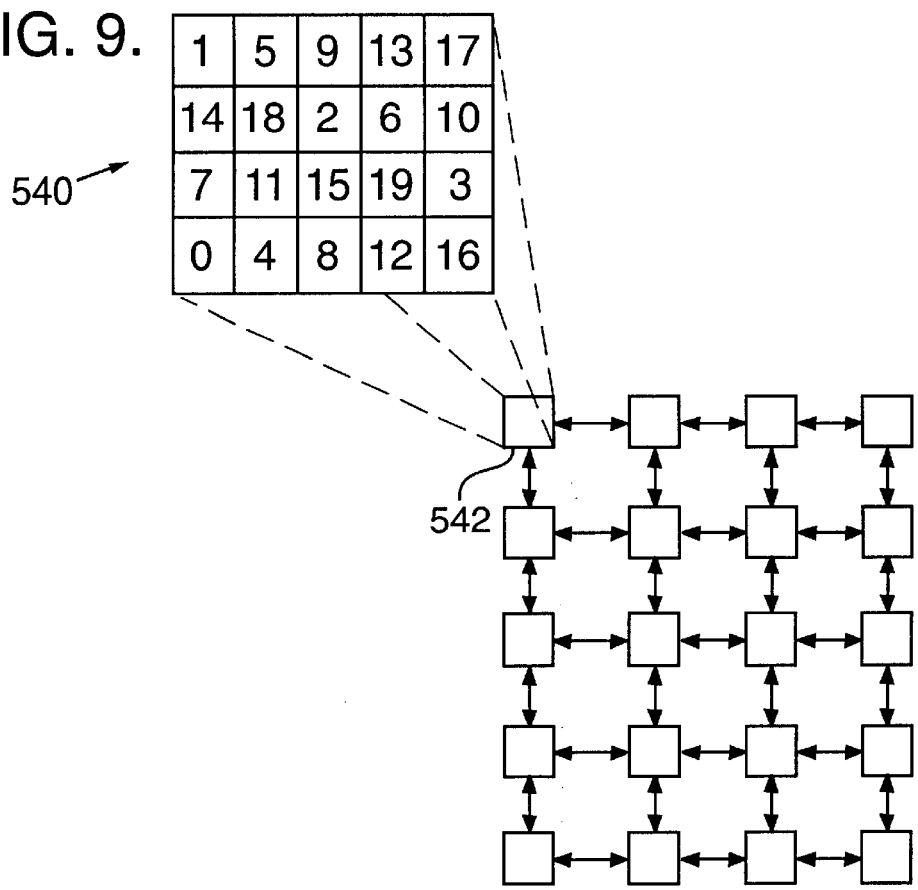
FIG. 9 is an example of an activity table showing start times for an iteration associated with virtual processors in a cluster. Each box in the table corresponds to a virtual processor in a cluster.

Let n=3; let $\vec{C}=(4,5)$. Assume that u=(0, 0, 1) is the smallest integer null vector of the space mapping. From (1), either $\vec{\tau}=(k_1, 4k_2, \pm 20)$ or $\vec{\tau}=(5k_1, k_2, \pm 20)$ where the greatest common divisor of $k_i$ and $C_i$ is 1 for i=1, 2. For example, $\vec{\tau}=(7, 4, 20)$ is a tight schedule (with $k_1=7, k_2=1, k_3=1$) that corresponds to the activity table shown in FIG. 9. The example in FIG. 9 shows the activity table for a four by five cluster of virtual processors (540) assigned to a physical processor element (e.g., processor element 542). In this example, the topology of the physical processor array is five vertical processor elements by four horizontal elements. The arrows joining the processors depict interprocessor communication.

The number in each box of the activity table denotes the residue modulo 20 of the times at which the virtual processor in that position within the cluster is active. For a tight schedule, these are all different (the $c_1$ axis is the vertical axis in the diagram).

4.2.3 Optimizing Cluster Topology

As described above, the cluster shape is derived from the mapping of virtual processor axes to physical processor axes. There are typically two or more choices for this mapping that will produce a satisfactory iteration mapping and scheduling. The front end code may simply pick one of these choices. It can achieve a better result, however, by trying each of the possible choices and picking one that results in the best cost and performance (e.g., shortest total schedule).

4.3 Code Transformation

After determining the iteration mapping and scheduling, the front-end performs a series of loop transformations. These transformations are described in sections 4.3.1 to 4.3.5.

4.3.1 Tiling

The tiling process (318) partitions the iterations in the nested loop based on the tile dimensions computed previously. Tiling transforms the code to a sequential loop over tiles having the form:

```
for (tile)
    for (point in tile) {
    }
```

Applied to the running example of the FIR filter, tiling yields:

```
/* This loop runs on the host, and loops over tiles */
for jb=0; jb<n2; jb+=tile_size_2
    /* loop nest, over one tile */
    for (i=0; i≤n1-n2; i++)
        for (jp=0; jp<tile_size_2; jp++)_ {
            j=jb+jp;
            if (j<n2) {
                y[i]=y[i]+w[j]*x[i+j];
            }
        }
```

4.3.2 Uniformization

Uniformization is a method for transforming the code so as to eliminate anti- and output dependences, and to reduce transfers between local and global memory (e.g., load and store operations in a processor element). By eliminating depedences, uniformization increases the amount of parallelism present in the loop nest. It also reduces accesses between local storage and global memory. Preferably, each processor array should propagate a result from a producer operation in one iteration to a consumer operation in another iteration without accesses to global memory, except as necessary at loop boundaries (e.g, a tile boundary). As part of this code transformation process, the front end converts arrays in the loop body into uniformized arrays.

To uniformize an array, the front end uses the dependence data to convert the array indices such that each element of the array is defined at one unique iteration (320). This process is referred to as dynamic single assignment. Uniformized arrays are realized by the back end as registers local to the physical processor elements, while ordinary arrays hold data in global memory (e.g., main memory of the host processor).

Based on the dependency data in the data flow graph, the uniformized arrays for our running example are:

WW[i][j] which holds w[j]
XX[i][j] which holds x[i+j]
YY[i][j] which holds y[i]

from the dependence relation involving x we know that

XX[i][j]=XX[i-1][j+1]

We can use this to define XX[i][j] whenever (i-1, j+1) is a valid iteration, i.e., when i>0 and jp<tile_size_2-1. Otherwise, we need to load data from global memory as shown below:

if (i==0 or jp==tile_size_2-1)
   XX[i][j]=x[i+j]

The uniformized loop nest over one tile in full is for (i=0; i<n1-n2; i++)
  for (jp=0; jp<tile_size_2; jp++) {
    j=jb+jp;
    if (jp>0)
      YY[i][jp]=YY[i][jp-1];
    else YY[i][jp]=y[i];
    if (i>0 && jp<tile_size_2-1)
      XX[i][jp]=XX[i-1][jp+1];
    else XX[i][jp]=x[i+j];
    if (i>0)
      WW[i][jp]=WW[i-1][jp];
    else WW[i][jp]=W[j];
    YY[i][jp]=YY[i][jp]+XX[i][jp]*WW[i][jp]
    if (jp==tile_size_2-1)
      y[i]=XX[i][jp];
  }

4.3.4 Loop Transformation

In the next phase of loop transforms, the front end converts the current form of the loop nest to a time-physical processor space based on the selected iteration schedule (322).

The front end converts the code to physical processor code using clustering. In this phase, it transforms the code from iteration space to time-physical processor space. The t loop bounds are derived from the schedule and the tile shape; the processor loop bounds are given by the selected processor topology.

References to a uniformized array such as XX[i-1][jp+1] are transformed first into a reference of the form XX[t-δt] [v$_1$-δv$_1$] where δt and δv$_1$ are given by $$\begin{bmatrix} \delta t \\ \delta v_1 \end{bmatrix} = \begin{bmatrix} \vec{\tau} \\ \Pi \end{bmatrix} \begin{bmatrix} 1 \\ -1 \end{bmatrix}.$$

These being the offset in the time and virtual processor coordinates between the start of iteration (i, jp) and the start of iteration (i-1, jp+1). For example, when $\vec{\tau}$ =(2, -3) and Π=(0, 1), XX[i-1][jp+1] is changed to XX[t-5][v$_1$+1]. Then, this reference is converted to the time, physical processor coordinates using the cluster shape and the cluster coordinate c$_1$. The assignment statement XX[t][v$_1$]=XX[t-5][v$_i$+1];

becomes if c$_1$=1)
  XX[t][sp$_1$]=XX[t-5][sp$_1$+1];
else
  XX[t][sp$_1$]=XX[t-5][[sp$_1$];

After this phase, the loop nest has the form:

t, p form
  for t = t$_{min}$, t$_{max}$
    for sp$_1$ = 0 to P$_1$-1 {
      ...
    }

The outer loop is a loop over time, and the inner loop is a loop over physical processor elements. Each processor element executes the inner time loop in a sequential order in lock step parallel with the others.

4.3.6 Recurrence Optimizations

In a recurrence optimization phase (324), the front end uses temporal recurrence to transform the loop programmatically from t-sp m to an optimized t-sp form (326).

After transformation to t-sp form, the loop body serves as a specification of each processor element. In an implementation that employs tiling, the loop nest has outer loops over tiles and an inner nest consisting of a sequential loop over time and a parallel nest over processors.

The transformed parallel loop body contains control code that we refer to as "housekeeping code." The housekeeping code includes code for computing various iteration coordinates, code for computing memory addresses, and code for testing loop bounds. Due to its computational complexity and potential memory usage, this code can be quite costly in terms of computation time, memory usage, and memory bandwidth. It is particularly important to reduce these costs to make the synthesized processor array more efficient.

The front end uses temporal recurrence to implement the housekeeping code. The front end generates code to compute various iteration coordinates, memory addresses, and loop bound tests locally in a processor element using values computed from a previous iteration. This method of exploiting temporal recurrence is implemented in two forms: 1) code is generated to update certain values from a previous iteration at a selectable time lag behind the current iteration; and 2) code is generated to maintain quantities that repeat periodically in a local storage buffer for later reuse.

The first form is implemented as a decision tree. The local processor element follows a path through the decision tree to one of its leaves. The value of the quantity for the current iteration is obtained by adding a constant to the value of that quantity from a previous iteration. The leaf provides the value of the added constant.

The second form is implemented in a local storage buffer having a depth corresponding to the repeat period of the desired quantity on the processor element. As explained further below, this repeat period is the number of virtual processors assigned to a physical processor element.

These approaches take advantage of the tight iteration schedule. In such a schedule, the physical processor visits each virtual processor assigned to it in a round robin fashion. With each visit, it executes the current iteration assigned to that virtual processor.

In the implementation, the housekeeping code has several forms and functions:

Cluster Coordinates

The cluster coordinates, sometimes referred to as "local virtual processor coordinates," give the position of the currently active virtual processor. For a given time on a processor element, the processor element may need to compute the currently active virtual processor.

Global Virtual Processor Coordinates

The global virtual processor coordinates give the position of a virtual processor in the time-virtual processor space.

Iteration Space Coordinates

The iteration space coordinates are the coordinates of an iteration in the original coordinate space of the nested loop. These coordinates sometimes appear in the transformed code.

Memory Addresses

The memory address is the location of an array element whose indices are affine functions of the iteration space coordinates. When data is Live-in or Live-out to the loop nest, it is read in or stored into global memory. In these circumstances, the local processor needs to compute the global memory address for the element.

Boundary Predicates

Sometimes referred to as guards, these quantities represent tests of loop boundary conditions. These loop tests include cluster edge predicates, tile edge predicates, and iteration space predicates. Cluster edge predicates indicate whether an iteration is at the boundary of a cluster. Tile edge predicates indicate whether an iteration is at the boundary of a tile. Finally, iteration space predicates test the coordinates against the limits of the iteration space.

With a tight schedule, the cluster and virtual processor coordinates, and all but one of the global iteration coordinates are periodic with a period equal to the number of virtual processors per cluster. The one global iteration coordinate that is not periodic is the coordinate chosen to be parallel to the null direction. The cluster coordinates are periodic functions. The other coordinates and memory addresses are linear functions of time and the cluster coordinates. Most of the boolean predicate values are defined by linear inequalities in the cluster coordinates, and as such, are also periodic.

One approach for exploiting temporal recurrence is to implement a circular buffer of depth equal to the number of virtual processors in a cluster. This buffer is used to store recurring values. With each iteration, the values in the circular buffer are advanced one position so that the recurring value corresponding to the current iteration is generated. This approach has the drawback of requiring a large buffer when the cluster size is large.

An alternative approach is to update the cluster coordinates $\vec{c}(t, \vec{p})$ from their values at an arbitrary previous cycle but on the same processor: $\vec{c}(t, \vec{p}) = R(\vec{c}(t-\delta t, \vec{p}))$ (here R stands for the recurrence map that we now explain.) In this approach, the front end may select any time lag $\delta t$, as long as $\delta t$ is not so small that the recurrence becomes a tight dataflow cycle inconsistent with the selected iteration schedule. The form of R is straightforward. Using a binary decision tree of depth (n-1), we find at the leaves of the tree the increments $\vec{c}(t, \vec{p}) - \vec{c}(t-\delta t, \vec{p})$. The tests at the nodes are comparisons of scalar elements of $\vec{c}(t-\delta t, \vec{p})$ with constants that depend only on $\vec{C}$ and the schedule $\vec{\tau}$. They are thus known at compile time and can be hard coded into the processor hardware.

Many quantities are linearly dependent on time and the cluster coordinates, and thus, may be computed in a similar fashion. The global virtual processor coordinates $\vec{v}$, the global iteration space coordinates $\vec{j}$, and the memory addresses are all linear functions of them. Once the front end selects the change in $\delta t$ and the change in $\vec{c}$ then it can programmatically generate code to compute the changes in all of these derived values, and these changes appear as explicit constants in the generated code. Only one addition is needed to compute each such value. This approach reduces the problem of cost reduction to that of the update of the cluster coordinates.

Next, we describe how to generate this decision tree programmatically. It is possible to construct the decision tree without resorting to construction and exploration of the activity table. Since $\vec{\tau}$ is tight, we know that (up to permutation of the indices, and with the proviso that $\Pi$ consists of the first (n-1) rows of the identity:

$$\vec{\tau} = (k_1, k_2 C_1, \ldots, k_{n-1} C_1 \ldots C_{n-2}, \pm \gamma) \quad (2)$$

where the greatest common divisor$(k_i, C_1) = 1$ for all $1 \leq i \leq n-1$ and $$\gamma = C_1 \ldots C_{n-1}.$$

We consider the set C of cluster coordinates within a cluster of virtual processors, i.e. within one physical processor:

$$C = \{\vec{c} \in Z^{n-1} | 0 \leq c_k < C_i, k=1, \ldots, (n-1)\}$$

For every position $\vec{c} \in C$, we associate a local clock at which the given virtual processor is active $$t_c(\vec{c}) = \tau_1 c_1 + \ldots \tau_{n-1} c_{n-1} (\text{mod } \gamma)$$

$t_c$ maps C one-to-one onto $[0 \ldots (\gamma-1)]$. Let $\delta t$ be a given time lag. We wish to know the set B of all of the differences of positions (members of C-C, the set of differences of cluster coordinate vectors) that can occur as values of $t_c^{-1}(t+\delta t) - t_c^{-1}(t)$. For convenience, we use $\vec{\tau}$ for its first (n-1) components wherever convenient. By definition, B consists of the position-difference vectors $\vec{x}$ that satisfy $\vec{\tau}$. $\vec{x} \equiv \delta t (\text{mod } \gamma)$. By (2), we have $$k_1 x_1 + k_2 C_1 x_2 + \ldots + k_{n-1} \times \ldots \times C_{n-2} x_{n-1} \equiv \delta t (\text{mod } \gamma) \quad (3)$$

Now divide $\delta t$ by $C_1$: then $\delta t = q_1 C_1 + r_1$ where $0 \leq r_1 < C_1$. By (3), we have that $k_1 x_1 \equiv r_1 \mod C_1$, so that $x_1 \equiv k_1^{-1} r_1 \mod C_1$, (recall that $k_1$ and $C_1$ are relatively prime, so that $k_1$ has an inverse in the additive group of the integers modulo $C_1$). Because $x \in B$ has elements bounded in absolute value by the elements of C, it follows that there are only two possible values for $x_1$:

$$x_1 \in \{k_1^{-1} r_1 \mod C_1, (k_1^{-1} r_1 \mod C_1) - C_1\}$$

These are the two possible differences of the first coordinate of $\vec{c}(t+\delta t)$ and $c(\vec{t})$. The choice is made on the simple basis of which leads to a new point in the activity table. Only one can. So $$c_1(t + \delta t) = c_1(t) + \begin{cases} k_1^{-1} r_1 \mod C_1 & \text{if } (c_1(t) + k_1^{-1} r_1 \mod C_1) < C_1 \\ k_1^{-1}(r_1 \mod C_1) - C_1 & \text{otherwise} \end{cases}$$

Pursuing this line of argument, for each choice of change in first coordinate, $x_1$, we determine the two possible choices for the change in the second coordinate, $x_2$. From (3) we have that $$k_2 C_1 x_2 + \ldots + k_{n-1} C_1 \times \ldots \times C_{n-2} x_{n-1} \equiv (\delta t - k_1 x_1)(\text{mod } \gamma).$$

We already know that $\delta t - k_1 x_1$ is a multiple of $C_1$. Thus, we have that $$k_2 x_2 \equiv ((\delta t - k_1 x_1)/C_1)(\text{mod } C_2)$$

Thus, as before, we conclude that $$x_2 \in \{k_2^{-1}((\delta t - k_1 x_1)/C_1) \text{mod } C_2, (k_2^{-1}((\delta t - k_1 x_1)/C_1) \text{mod } C_2) - C_2\}$$

Continuing in this way, we arrive at the tree of changes of cluster coordinates.

To illustrate this approach, consider the example shown in FIG. 9.,

Take $\delta t = 1$ $\vec{C} = (4, 5)$ and $\vec{\tau} = (7, 4, 20) = (k_1, k_2 C_1, \tau)$ where $k_1 = 7$ and $k_2 = 1$ thus, $r_1 = 1$, $k_1^{-1} r_1 \text{mod } C_1 = 7^{-1} \text{mod } 4 = 3$, and $$C_1(t+1) = C_1(t) + \begin{cases} 3 & \text{if } C_1(t) + 3 \leq 3 \\ -1 & \text{otherwise} \end{cases}$$

Now consider the decision tree branch for $C_1(t)=0$, in which $x_1 = C_1(t+1) - C_1(t) = 3$. Then $$k_2 x_2 = x_2 \equiv ((\delta t - k_1 x_1)/C_1) \text{ mod } C_1$$
$$= ((1 - 7 \cdot 3)/4) \text{ mod } 5$$
$$= -5 \text{ mod } 5$$
$$= 0$$

which is precisely the correct change to $c_2$ for the times at which $c_1$ changes from 0 to 3.

The decision tree for this example is:

```
if (c(1)==0) {
  c(1)+=3;
  c(2)+=0;
} else {
  c(1)+=(-1);
  if (c(2)<3) {
    c(2)+=2;
  } else {
    c(2)+=(-3);
  }
}
```

The decision tree approach can also be explained from a matrix-oriented and geometric viewpoint that has the additional advantage of simplifying the computation of the different changes in coordinates.

$H_m$ is the Hermite National Form of M. T is the basis of $Z^n$ such that $MT = H_m$; the first row of MT gives the time difference along each column vector of T, and the last rows are the coordinates of the column vectors of T in the virtual processor array. Since the first row of MT is $(1, 0, \ldots, 0)$, the first column $\vec{w}$ of T connects an isochrone to the next isochrone, and the remaining columns $\vec{t}_2, \ldots, \vec{t}_n$ lie in an isochrone. An isochrone is a set of iterations scheduled to start at time t. In geometric terms, it is an (n-1) dimensional plane that contains all iterations that start at a given time.

Given the iteration $\vec{j}$, what we want to find is a vector $\vec{k}$ such that $M(\vec{j} + \vec{k}) = (t + \delta t, \vec{z})^t$ where $\vec{z}$ is in the activity table. We know already that $\vec{k}$ exists and is unique since the schedule starts one iteration per initiation interval on each processor. This can also be seen from the fact that $H_m$ has the $C_i$'s on the diagonal: writing $\vec{k} = T\vec{\lambda}$, we end up with a triangular system that can be easily solved thanks to the structure of $H_m$. We can add a suitable linear combination of $\vec{t}_2, \ldots, \vec{t}_n$ to $\delta t \times \vec{w}$ (the first component of $M(\delta t \times \vec{w})$ does not change) so that the (n-1) last components of $M(\delta t \times \vec{w})$ are in the activity table. This vector (let us denote it by $\vec{\delta}[0, \ldots, 0]$) will be one of the candidates in the decision tree. Now, either the second component of $M(\vec{j} + \vec{\delta}[0, \ldots, 0])$ is still strictly less than $C_1$, then we are in the first case (first branch of the tree), or this component is strictly less than $2C_1$ and we simply subtract $\vec{t}_2$ to go back in the activity table: $\vec{\delta}[0, \ldots, 0] = \vec{\delta}[0, \ldots, 0] - \vec{t}_2$ (plus possibly a linear combination of $\vec{t}_3, \ldots, \vec{t}_n$ so that the (n-2) last components of $M\vec{\delta}[1, 0, \ldots, 0]$ are in the activity table), is one of the candidates in the decision tree. Continuing in this way, we end up with at most $2^{(n-1)}$ vectors (at most two cases for each dimension, and only one when the corresponding component of the move vector is zero).

The notation in brackets for the vectors $\vec{\delta}$ specifies if the move is nonnegative (0) or negative (1): for example, $\vec{\delta}[0, 1, 1]$ corresponds to the case where we move forward in the first dimension, and backward in the two other dimensions.

We illustrate this technique on the example shown in FIG. 9 and discussed in Section 4.2.2.

The Hermite Form of the mapping ($MT = H_m$) is:

$$\begin{pmatrix} 7 & 4 & 20 \\ 1 & 0 & 0 \\ 0 & 1 & 0 \end{pmatrix} \begin{pmatrix} 3 & 4 & 0 \\ 0 & 3 & 5 \\ -1 & -2 & -1 \end{pmatrix} = \begin{pmatrix} 1 & 0 & 0 \\ 3 & 4 & 0 \\ 0 & 3 & 5 \end{pmatrix}$$

We take $\delta t = 1$ from the matrix $H_m$, we read that we may have to move along $\vec{w} = (3, 0)$ in the virtual space (which corresponds to the vector $\vec{\delta}[0, 0] = (3, 0-1)$ in the original space). If $c_1 + 3 \geq 4$, then we subtract the second column of $H_m$, i.e. (4, 3), we find the move vector (-1, -3), and we add the third column to go back in the box: $(3, 0) - (4, 3) + (0, 5) = (-1, 2)$. This corresponds in the original space to $\vec{\delta}[1, 0] = (3, 0, -1) - (4, 3, -2) + (0, 5, -1) = (-1, 2, 0)$. Then, for both vectors, we check the last component: in the first case, no other vector is required since the second component of (3, 0) is 0. In the second case, we may have to subtract (0, 5): the last candidate is thus $(-1, 2) - (0, 5) = (-1, -3)$ and $\vec{\delta}[1, 1] = (-1, 3, 1)$.

The decision tree for this example is the same as the one provided above.

Figure 12:
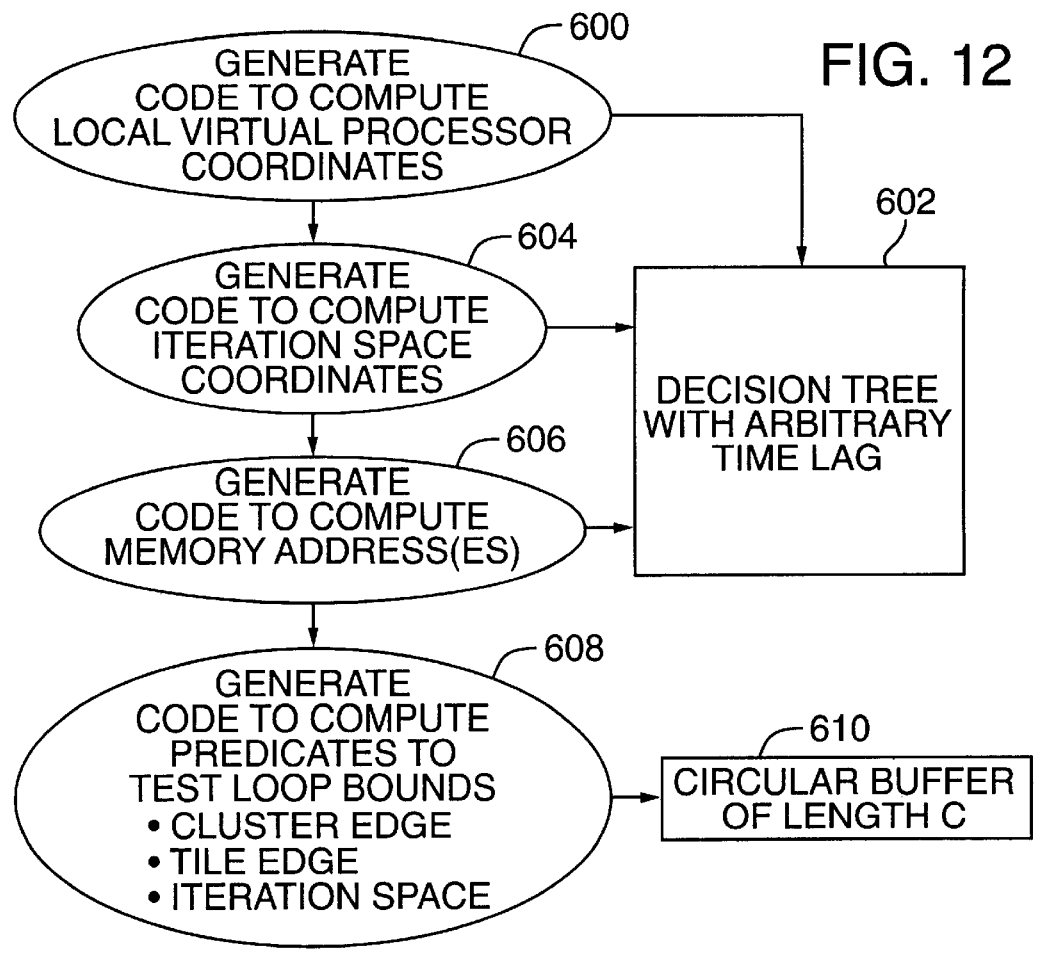
FIG. 12 shows a method for generating housekeeping code to compute iteration coordinates, memory addresses, and predicates efficiently using temporal recursion.

FIG. 12 is a flow diagram summarizing how the front end generates housekeeping code that exploits temporal recurrence.

The front end begins by generating the code of the decision tree for the local virtual processor coordinates and the mapped out coordinate (600). As illustrated in the example above, the generated code at the leaves of the decision tree specify the value of each local virtual processor coordinate as a function of the virtual processor coordinate at a selected prior time plus a constant. The time lag is arbitrary, yet must be large enough so that the result of the calculation of the coordinate at the prior time is available to compute the coordinate in the current iteration. An example of the code generated at this point is:

```
if (c1[t-2]<2)
    c1[t]=c1[t-2]+3
    if (c2<4)
        c2[t]=c2[t-2]+3
        k[t]=k[t-2]+4
    else
        c2[t]=c2[t-2]-4
        k[t]=k[t-2]+6
else
    c1[t]=c1[t-2]-2
    c2[t]=c2[t-2]
    k[t]=k[t-2]+7
```

In the implementation, the global iteration coordinates correspond to the global virtual processor coordinates, except for the global iteration coordinate in the mapping direction (this is the mapped out coordinate). As such, the global iteration coordinates, except for the mapped out coordinate, are computed similarly as the global virtual processor coordinates.

The front end proceeds to generate code to compute other quantities that are linearly dependent on the local virtual processor coordinates. As it does so, it augments the decision tree code (602) with program statements that express these quantities in terms of their values at a selected previous time on the same processor element plus a constant.

The global virtual processor coordinates for the current iteration are equal to the local virtual processor coordinates plus a constant. As such, the change in the local virtual processor coordinate between the current and selected previous time is the same as the change in the global virtual processor coordinate. Furthermore, the remaining global iteration space coordinates are identical to the global virtual processor coordinates. The front end generates the program statements to compute the remaining global iteration coordinates for the current iteration in the same way as the corresponding local virtual processor coordinates (604).

Continuing the example, the decision tree code now looks like:

```
if (c1[t-2]<2)
    c1[t]=c1[t-2]+3
    i[t]=i[t-2]+3
    if (c2<4)
        c2[t]=c2[t-2]+3
        j[t]=j[t-2]+3
        k[t]=k[t-2]+4
    else
        c2[t]=c2[t-2]-4
        j[t]=j[t-2]-4
        k[t]=k[t-2]+6
else
    c1[t]=c1[t-2]-2
    c2[t]=c2[t-2]
    i[t]=i[t-2]-2
    j[t]=j[t-2]
    k[t]=k[t-2]+7
```

Next, the front end generates the code to compute memory addresses of array elements in the loop body (606). Based on the linear mapping of iterations to physical processors, the memory address of an array element, e.g., a[i+j−3*k+2] has the form addr_of_element=Ci*i+Cj*j+Ck*k+C0. At this point, the front end has computed the constants C0, Ci, Cj, and Ck. Thus, it can now compute a change in a memory address from the changes in i, j, and k. The resulting decision tree code looks like:

```
if (c1[t-2]<2)
    c1[t]=c1[t-2]+3
    i[t]=i[t-2]+3
    if (c2<4)
        c2[t]=c2[t-2]+3
        j[t]=j[t-2]+3
        k[t]=k[t-2]+4
        addr_of_element[t]=addr_of_element[t-2]+
            Ci*3+Cj*3+Ck*4
    else
        c2[t]=c2[t-2]-4
        j[t]=j[t-2]-4
        k[t]=k[t-2]+6
        addr_of_element[t]=addr_of_element[t-2]+
            Ci*3+Cj*(-4)+Ck*6
else
    c1[t]=c1[t-2]-2
    c2[t]=c2[t-2]
    i[t]=i[t-2]-2
    j[t]=j[t-2]
    k[t]=k[t-2]+7
    addr_of_element[t]=addr_of_element[t-2]+Ci*(-
        2)+Cj*(0)+Ck*7
```

The constant expressions can be evaluated and simplified to a single constant at compile time or during initialization in the host processor.

The local storage for the decision tree approach can be implemented efficiently using a FIFO buffer of depth equal to the selected time lag. Initial values for the FIFO buffer may be computed and stored in local or global storage at compile time or during initialization in the host processor.

Next, the front end generates the code to compute boundary predicates (608). Most predicates, except those dependent on the mapped out coordinate, are periodic with a period equal to the cluster size. Iteration space predicates test whether an iteration is within the bounds of the iteration space. They are periodic, except for those dependent on the mapped out coordinate.

The tile edge predicate is used for load/store control, and in particular, to propagate read-only arrays. These predicates are periodic unless dependent on the mapped out coordinate.

Cluster edge predicates indicate whether an iteration is at a cluster boundary, and as such, indicate whether to select local or remote data reference.

The local storage for the circular buffer approach can be implemented efficiently using a circular buffer of depth equal to the size of the cluster. Values for the circular buffer may be computed and stored in local or global storage at compile time or during initialization in the host processor.

4.3.6 Assembly Code Generation

Assembly code generation is an implementation specific process for transforming the optimized loop nest code from the form used in the front end to the form used in the back end.

The front end uses a machine-independent representation for programs that is well suited for loop transformations and other high level parallelizing transformations. In particular, the front end employs routines and the machine independent representation of the SUIF compiler, a publicly available compiler from Stanford University.

The implementation of the back-end takes a machine dependent control flow graph (CFG) representation of the program as input. The specific representation used in the implementation is publicly available as part of the TRIMARAN software from New York University. The back end uses the Elcor compiler of the Trimaran software to prepare the loop for synthesis and to perform modulo scheduling of the operations in the loop body.

In the process of converting to machine dependent CFG form, this phase translates the high level representation to operations for a parameterized family of processors, called HPL-PD, which is described in Vinod Kathail, Michael Schlansker, Bantwal Ramakrishna Rau. HPL PlayDohArchitecture Specification: Version 1.0. Technical Report HPL-93-80. Hewlett-Packard Laboratories, February, 1994.

This phase produces two files: one contains the machine dependent CFG for the loop nest in textual form, and the other is the annotation file. The processor array specification, which includes the topology and performance constraints, is provided in another file from the front end. The back end uses these three files to synthesize a processor array programmatically.

5.0 Back-End Components and Methodology

Figure 13:
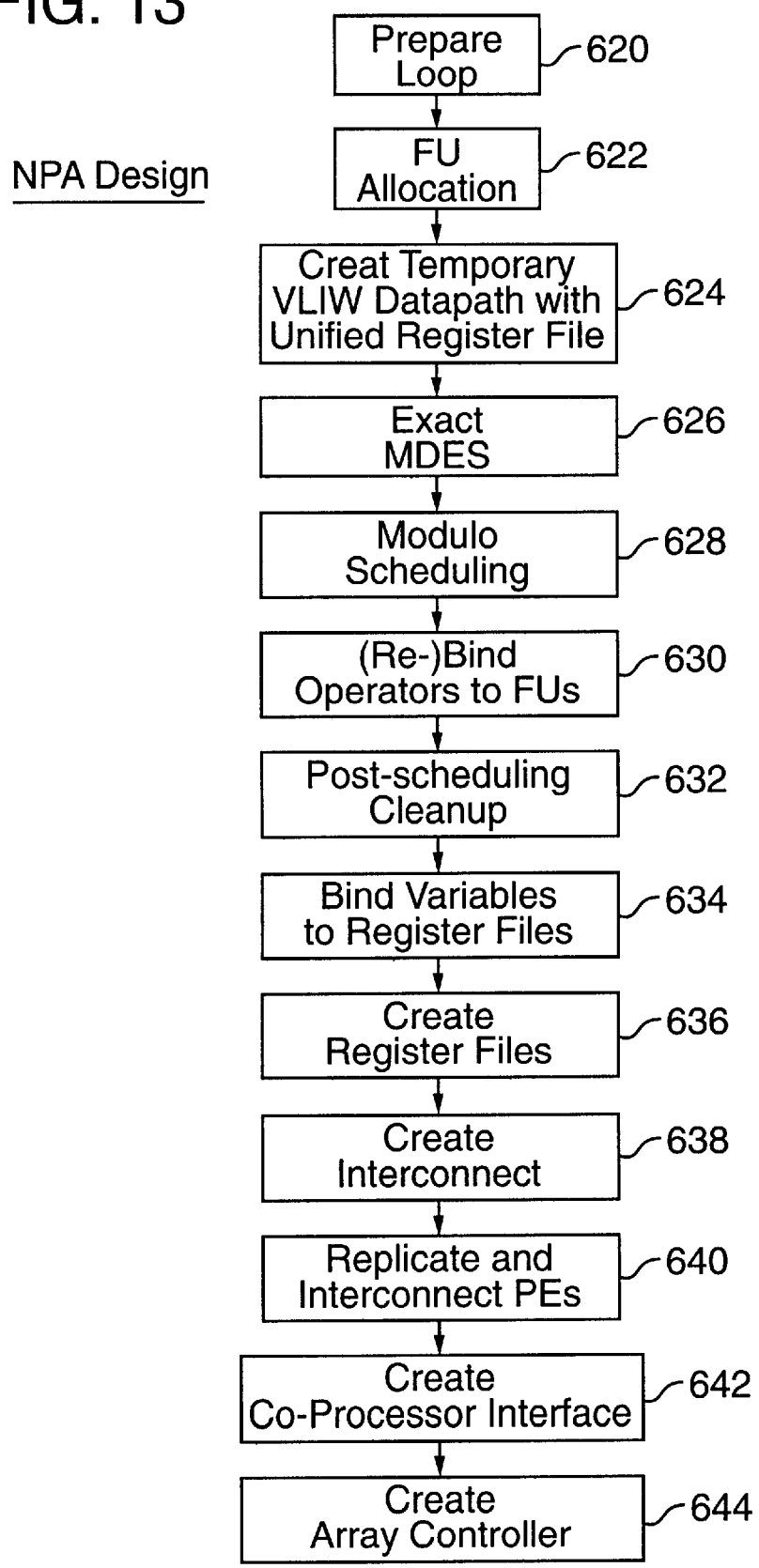
FIG. 13 is a design flow diagram illustrating a process for synthesizing a non-programmable processor array from a code listing of a single loop nest.
Figure 14:
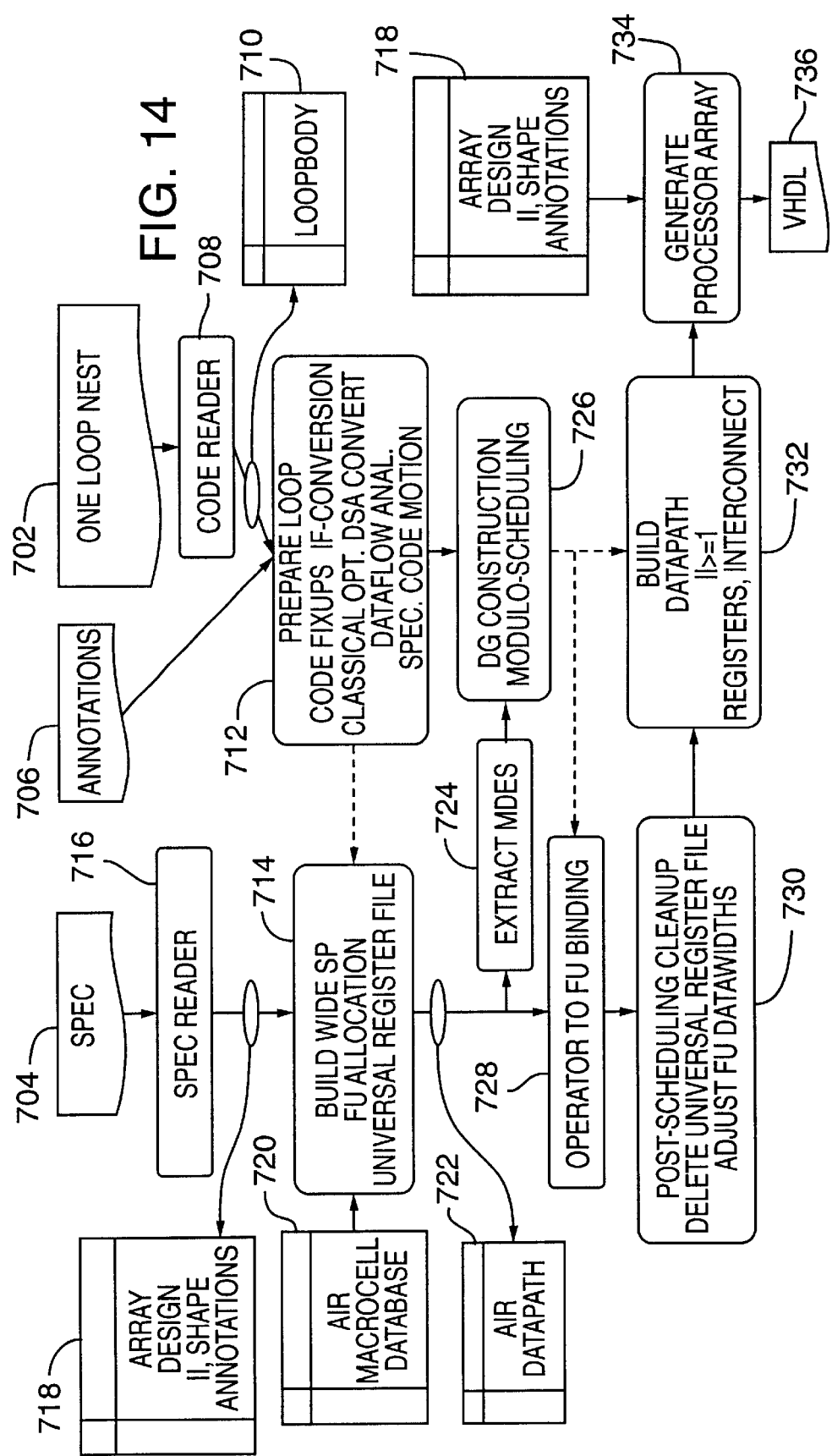
FIG. 14 is a design flow diagram illustrating a system and methodology for synthesizing a non-programmable processor array from input including a single loop nest and a performance constraint on the processor array.

FIGS. 13–14 illustrate the components and methodology of a non-programmable array (NPA) synthesis system. FIG. 13 shows a flow diagram of the synthesis process, while FIG. 14 shows components and data structures of the synthesis system and their relationship. The following subsections of section 5 are cross-referenced by reference number to the elements of the flow diagram of FIG. 13. Later, we describe how to synthesize a programmable processor array with reference to a similar flow diagram (see FIG. 25).

As shown in FIG. 14, the implementation of the synthesis system has the following inputs: 1) a single loop nest 702; 2) a processor array specification 704; 3) and code annotations 706. In the current implementation, the code generator in the front end provides an assembly code version of the single loop nest in textual form, along with an annotations file.

The annotations file provides a mapping of uniformized arrays in the front end code to expanded virtual registers (EVRs) in the back end along with data dependences expressed as time/space distances for each variable reference. The time distances identify intra and inter iteration dependences on the same processor and the space distances identify inter-processor data communication within the processor array. The annotation file also specifies global variables that remain as global memory references in the transformed loop nest. In addition, the annotation file specifies the mapping of non-uniformized, non-global variables to static registers within each processor.

In the interface with the processor array, the host VLIW processor views live-in and live-out variables of the processor array as residing in its local memory. The annotation file identifies live-in/live out variables and assigns to them memory addresses in the host processor's local memory space.

In the current implementation, a code translator transforms the front end code to the back end code format and generates the annotation file. The front end uses a predefined naming convention for identifying uniformized arrays, global variables, and non-uniformized/non-global variables. These naming conventions allow the translator to identify the variable types and generate the entries in the annotation file.

The data flow analysis of the front end identifies the live-in, live out variables. The live-in variables are the variables that the host processor initializes before the processor array executes the loop nest, and the live-out variables are the variables that the host processor may query when the processor array has completed execution of the loop nest. These variables may either map to EVRs or static registers on the processor array side.

The processor array specification (714, FIG. 14) refers to the processor constraints such as the shape and size of the physical processor array, the initiation interval, memory bandwidth constraints, memory ports etc. These constraints are conveyed from the from the front end to the back end in a separate file (704).

The information either from the source program or from front end computations is kept in the internal representation. At the time of assembly code generation, the information is written out to a file in a simple text format.

The code reader 708 converts a single time loop from text form into an internal data structure representation 710. The back end programmatically converts this internal representation of the loop body into a processor array described in VHDL. The details of the implementation are provided in sections 5.1 to 5.12.

5.1 Prepare Loop (620)

To prepare the loop for synthesis (712), the system employs compiler analyses and transformations/optimizations on the loop body. These processes are implemented in a collection of program modules that transform the code into an optimized form for synthesis in hardware. In the current implementation, the system utilizes code transformation routines in the SUIF compiler in the front end and routines from the Elcor compiler in the back end. The front end employs parallel compiler optimizations and transformations to map the sequential loop nest into parallel code, while the back end employs instruction level parallelism optimizations to optimize the processor element design.

These compiler processes include If-conversion where conditional statements are converted to predicated operations. They also include one or more of the following analysis techniques: live-ness analysis, upward exposed definition analysis, downward exposed definitions analysis, downward exposed use analysis, reaching definitions analysis and def-use chains. Using the results of these analyses, the compiler performs one or more of the following transformations: dead code elimination, copy propagation/elimination, loop invariant removal, partial redundancy elimination, and common sub-expression elimination, strength reduction, constant propagation and folding, critical path reduction and speculative code motion. The back end performs one or more of the following forms of code generation: superblock formation, hyperblock formation in which if-conversion is used to create a hyperblock from basic blocks, trace formation, acyclic (superblock, hyperblock, trace) scheduling, modulo scheduling, register allocation for static registers and for rotating registers, and variable to register binding. Note that some of these techniques may be performed by or in conjunction with code transformation modules implemented in the front end with the SUIF compiler. While these compiler processes are currently used for optimizing code for a pre-existing processor, our use of these optimizations in the context of synthesizing a new processor design is novel. In our system, these methods optimize the code with synthesis metrics as constraints. Namely, the loop code is transformed so that the resulting hardware cost is minimized or reduced for a specified performance constraint (e.g., the initiation interval). Conversely, the loop code may be transformed to optimize performance for a specified cost constraint, such as chip area or gate count. In this case, the compiler estimates the cost based on an estimate of the resource requirements of the operations in the loop code.

The system uses If-conversion to remove conditional branches from the code of the loop body. In particular, a compiler routine in the back end uses predicated execution to remove branches from the loop body code. The predicated code distributes control flow to the operation level, and thus, simplifies the implementation of control in hardware. The use of predication facilitates the use of modulo scheduling to schedule the operations in the loop body efficiently. In addition, each of the code optimizations/transformations listed in the previous paragraph may be extended to be compatible with the predicated code using the Predicate Query System in the Elcor compiler from Hewlett-Packard Co. See U.S. Pat. No. 5,920,716, which is hereby incorporated by reference.

The back end synthesizes predicated code into hardware as explained further below. The hardware support for predicated code includes functional units and registers that support predication and interconnect logic to transfer predicate values in the processor datapath.

Figure 15:
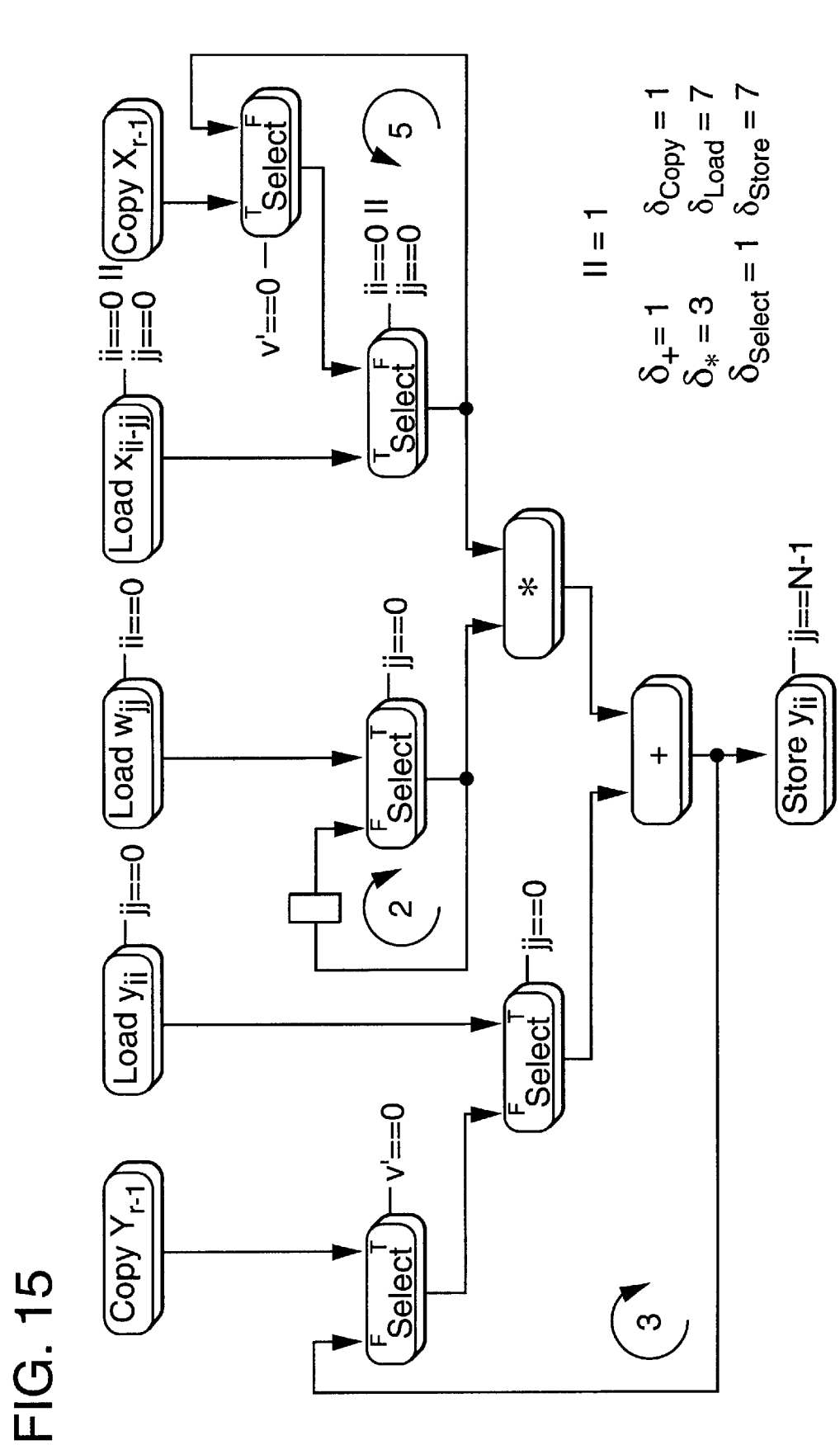
FIG. 15 is a graphical representation of the body of a nested loop showing dependencies between operations in the loop.

FIG. 15 provides a graphical example of the loop body before hardware synthesis commences. We will continue this example in the following sections to illustrate the programmatic synthesis process.

5.2 FU Allocation (622)

After preparing the loop, the back end builds the data path of a processor element (714). The specification reader 716 converts the external file form of the specification 704 into an internal data structure representation. Using the design specification 718 and the optimized loop body, a data path synthesizer constructs the data path for a processor element.

The data path synthesizer examines the operations in the loop body and allocates functional unit instances from a macrocell database 720 to execute these operations at the desired performance level (e.g., initiation interval). In a typical design, there are a number of potential choices of functional units that are sufficient to execute the operations in the loop body in the specified initiation interval. The functional unit allocation task may be implemented so as to minimize the cost of the functional unit selection while satisfying the required initiation interval.

One way of allocating functional units is to classify all operations by type and then to choose ⌈(No. of ops. of a type/II)⌉ minimum cost functional units that can perform operations of that type. For example, if the loop body has five add operations and three multiply operations, and the II is two, the above expression would give three MULTIPLY functional units (⌈(5/2)⌉=3) and two ADD functional units (⌈(3/2)⌉=2).

One way of allocating functional units with overlapping operation types is described in co-pending U.S. patent application Ser. No. 09/378,431, filed concurrently, entitled, "FUNCTION UNIT ALLOCATION IN PROCESSOR DESIGN" by Robert Schreiber, which is hereby incorporated by reference.

5.3 Create Temporary Datapath (624)

At this stage, the data path synthesizer assumes that the data path of the processor element has a "universal register file." The universal register file represents a full interconnect with storage like a cross bar switch, where all functional unit data outputs are connected to every other functional unit input after an arbitrary storage delay.

Figure 16:
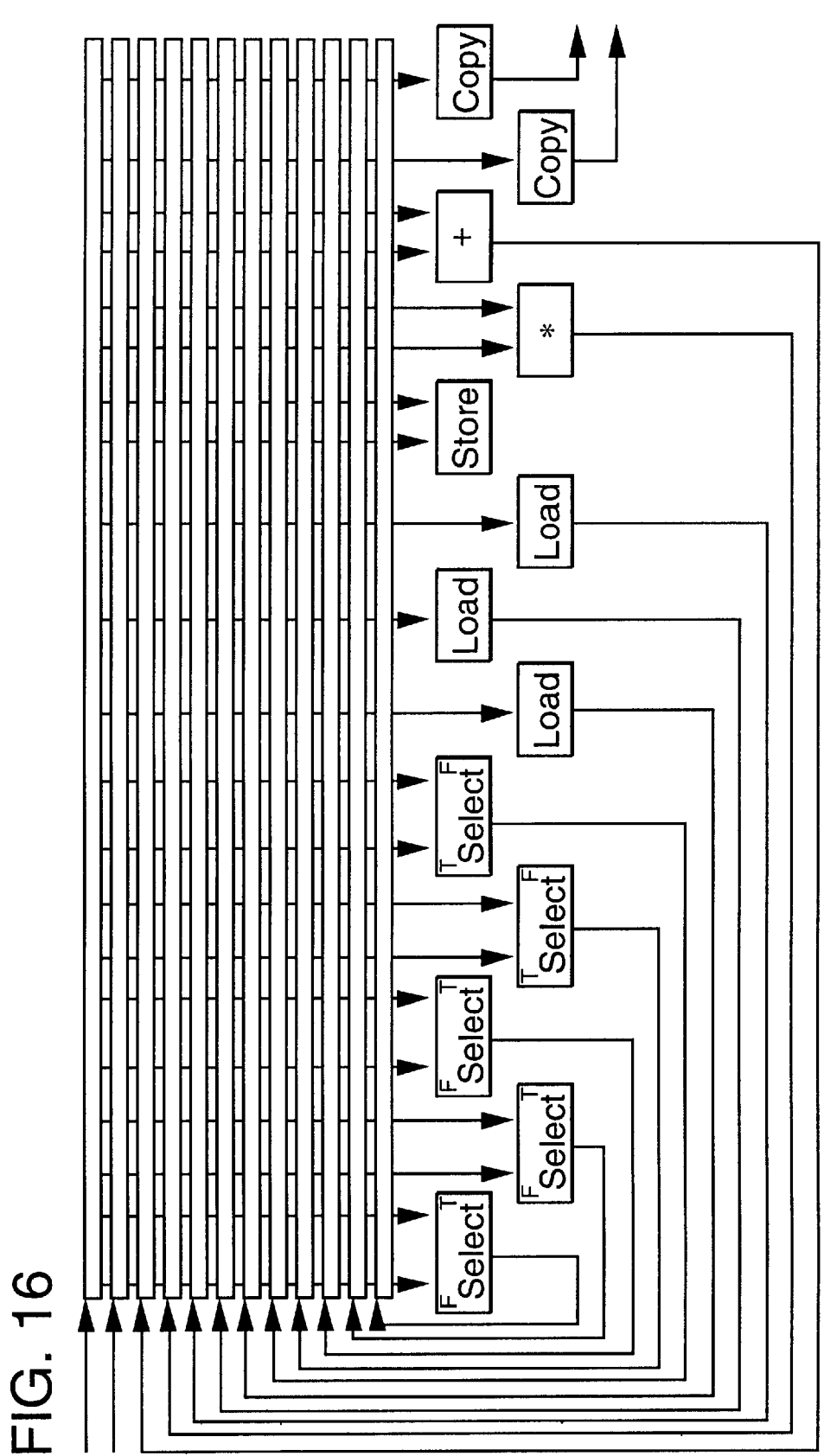
FIG. 16 is a block diagram showing a tentative data path design used to perform operation scheduling on the loop body of FIG. 14.

FIG. 16 illustrates an example of this type of interconnect based on the nested loop shown in FIG. 15. Each of the boxes represents hardware macrocells in the data path. The cross bar switch interconnects all of the inputs and outputs of these macrocells through a bank of storage elements. The only exceptions are the input and output ports connecting one processor element to another.

When the data path synthesizer allocates the functional units and the tentative interconnect, it records the data path in an AIR data structure 722.

While the data path is tailored to the t-sp loop executing on each processor in this implementation, the back end may be designed to synthesize the t-sp loop into alternative computing architectures. For instance, the back end may be implemented to synthesize the t-sp loop into an array of Explicitly Parallel Instruction Computer (EPIC) processors, or as an array of Very Long Instruction Word (VLIW) processors. Each array element, for example, may be a programmable VLIW processor with a user-visible instruction set. In this case, each VLIW processor element executes a corresponding t loop, which is stored in the element's RAM memory. Alternatively, the t loop assigned to each VLIW processor element may be hard-wired in the form of a finite state machine (FSM), or stored in a ROM memory. The operation repertoire of each processor is determined by its functional units, and the universal register file is partitioned into two or more physical register files according to operand type (predicate (boolean), integer, floating point, etc.) Such a processor may be synthesized programmatically as described below and in co-pending U.S. patent application Ser. No. 09/378,395, filed concurrently and entitled, "AUTOMATIC DESIGN OF VLIW PROCESSORS" by Shail Aditya Gupta, Bantwal Ramakrishna Rau, Vinod Kumar Kathail, and Michael S. Schlansker which is hereby incorporated by reference.

5.4 MDES Extraction (626)

Having constructed a tentative data path, the back end invokes an MDES extractor 724 to extract a machine description from the structural data path representation and the macrocell database. This code module extracts information needed to schedule the operations within the loop body. For each functional unit, the MDES extractor obtains the opcode repertoire, the input/output format of each opcode, its internal resource sharing constraints, and the latencies for each of its operands. The resource sharing constraints are expressed in the form of reservation tables that specify when a functional unit's resources (e.g., input and output ports) are in use relative to the initiation of an operation.

For more information on the process of extracting a machine description for use in operation scheduling, see U.S. patent application Ser. No. 09/378,601, entitled PROGRAMMATIC SYNTHESIS OF A MACHINE DESCRIPTION FOR RETARGETING A COMPILER, by Shail Aditya Gupta, filed concurrently herewith, which is hereby incorporated by reference. See also: Bantwal Ramakrishna Rau, Vinod Kathail, and Shail Aditya Gupta. Machine-description driven compilers for EPIC processors. Technical Report HPL-98-40, Hewlett-Packard Laboratories, September 1998; and Shail Aditya Gupta, Vinod Kathail, and Bantwal Ramakrishna Rau. Elcor's Machine Description System: Version 3.0. Technical Report HPL-98-128, Hewlett-Packard Laboratories, October, 1998, which are hereby incorporated by reference.

5.5 Dependence Graph Construction and Modulo Scheduling (628)

Next, the back end invokes a scheduler to compute a start time for each operation in the loop body. The scheduler determines a start time for each operation so that the resulting schedule achieves the desired throughput. While this implementation uses throughput to direct the scheduling and synthesis, it is also possible to direct the synthesis and scheduling using other constraints such as power consumption or cost measured in chip area or gates (e.g., cost of the FUs, interconnect, and registers). The back end may direct scheduling so as to optimize cost, performance (e.g., cycle time, initiation interval), or power consumption. The power consumption may be approximated by summing the expected power consumption of the various macrocells in the data path.

Before scheduling begins, the back end constructs a dependence graph of the loop body in which the dependences among operations are explicit. A scheduler then performs modulo scheduling (726) of operations in the loop body using a specified initiation interval as a constraint. For a detailed explanation of modulo scheduling, see B. R. Rau, "Iterative Modulo Scheduling," International Journal of Parallel Processing, vol. 24, pp. 3–64, 19, 96, which is hereby incorporated by reference. This document is also available as HP Labs Tech. Report HPL-94-115 from Hewlett-Packard Co.

Figure 17:
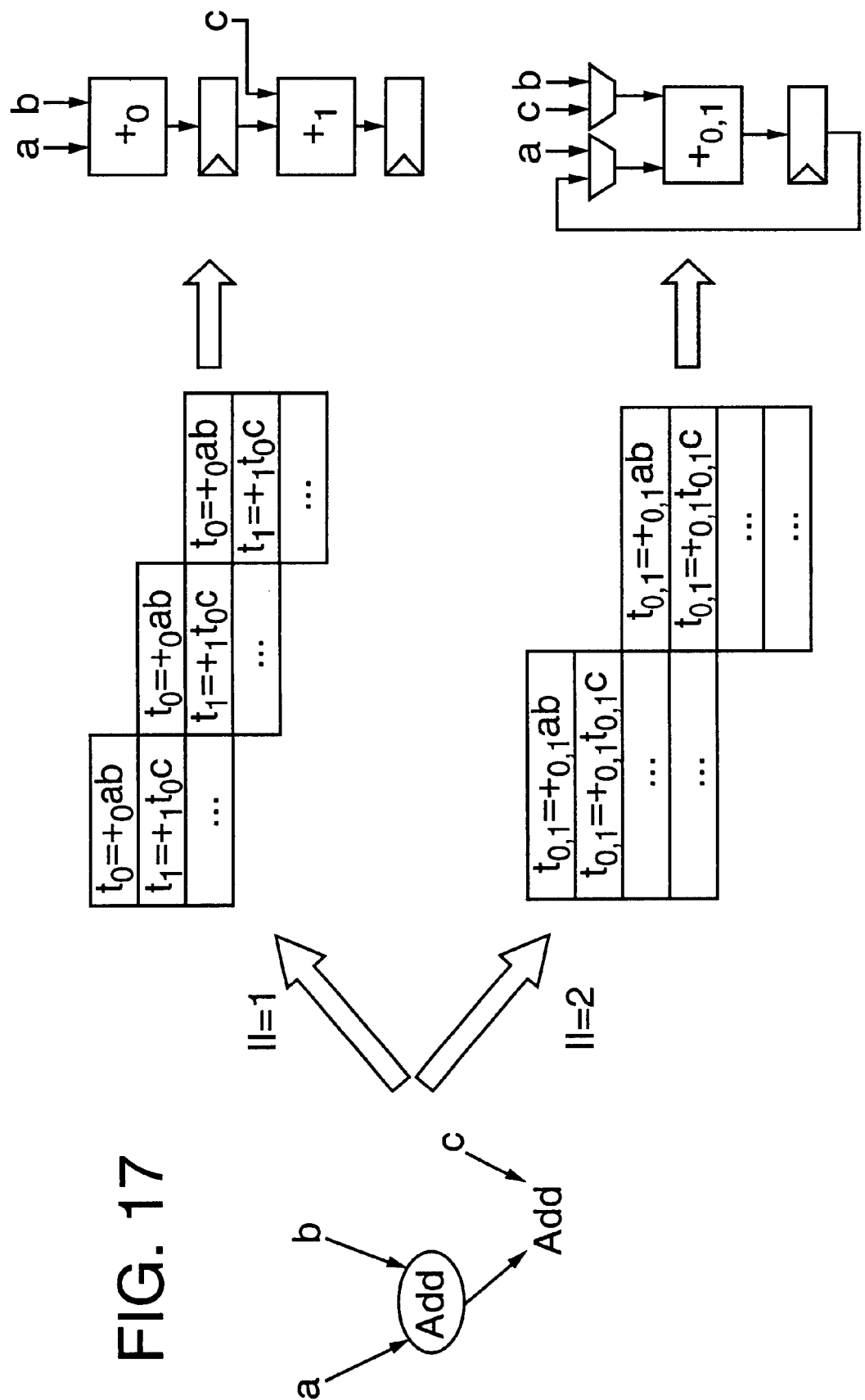
FIG. 17 is a diagram illustrating alternative data path designs and corresponding schedules to demonstrate throughput-directed data path synthesis and operation scheduling.

FIG. 17 provides an example of throughput directed scheduling for the operations represented in a simple data flow graph on the left of the figure. The figure shows two alternative schedules and data path designs to compare and contrast designs with different throughput constraints. In the top design, an iteration starts every cycle (i.e. the initiation interval is one). The corresponding data path has two functional units with one add operation per unit arranged in series. In the bottom design, an iteration starts every two cycles. The larger initiation interval provides more opportunity for sharing. In particular, a single functional unit implements both add operations in the loop body. While this form of sharing reduces the functional unit cost, it requires a more complex interconnect with muxing to implement resource sharing.

Figure 18:
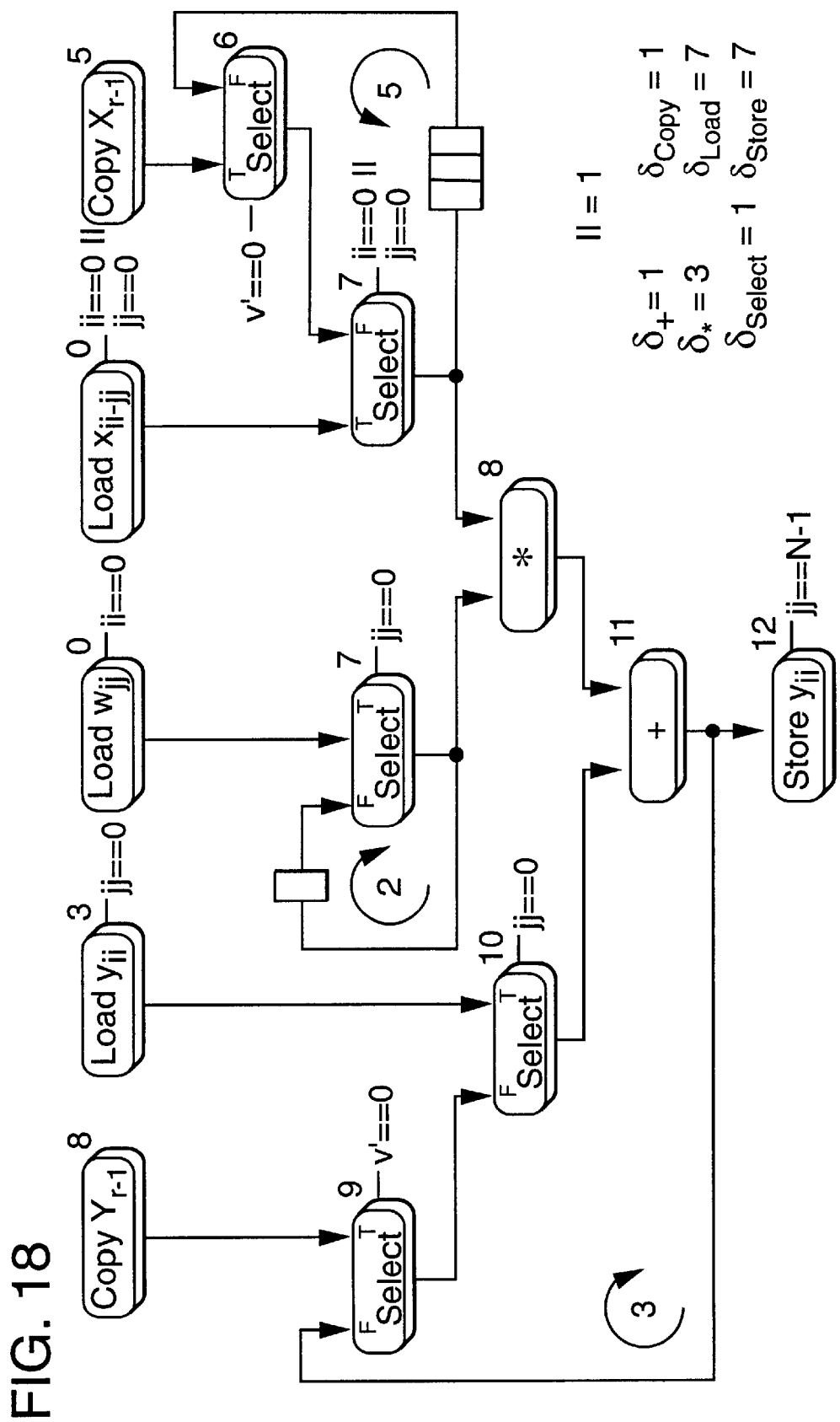
FIG. 18 is a diagram of the loop body shown in FIG. 14 annotated with operation start times and buffers to implement time delays where necessary to satisfy data dependence constraints.

Continuing the example shown in FIGS. 15 and 16, FIG. 18 shows a specific example of a modulo scheduled loop body. The modulo scheduling process uses time/iteration distance constraints on dependence edges to find a start time for each operation. The dependence distances are shown along the back edge of each recurrence cycle and the operation latencies ($\delta$) are shown on the lower right corner of FIG. 18. Using this information, the modulo scheduling process finds a start time for each operation (shown as the number adjacent to the operation) relative to the start time of the iteration (time=0) such that the scheduled time of an operation plus its latency is equal to the schedule time of the subsequent operation. In some cases, the scheduler leaves a time lag between a producer and consumer. Later, the synthesis process inserts a buffer (implemented as a FIFO macrocell) of length proportional to the time lag to ensure that data is transferred from a producer to a consumer at the right time to satisfy a dependence constraint.

At this stage, the back end has selected functional units and has scheduled start times for operations in the loop body. However, it has not mapped each operation to specific functional units.

5.6 Operator to FU Binding (630)

In this stage (728), the back end binds operations in the loop body to functional unit instances in the data path. The scheduler determines the start time of every operation. This stage determines a mapping of an operation to a functional unit.

In the current implementation, the scheduler provides a tentative mapping of operations to functional units and a start time for each operation. The back end synthesis may accept this tentative mapping or modify it further to optimize the cost of the hardware as measured in chip area, gates, or some combination of both. For each operation, there may be one or more functional units that are capable of executing the operation. The choice of operation to FU mapping impacts the cost of the interconnect and the overall cost of the functional units. The mapping impacts the interconnect because it affects the complexity of the select or multiplexor logic used to direct control and data to each functional unit as well as the topological complexity of the wiring (e.g., measured in number of busses). The mapping impacts the cost of the functional units because each functional unit is sized to accommodate the operations assigned to it. Using a measure of the interconnect and/or functional unit cost, the back end selects the mapping that achieves the lowest cost while staying within the specified initiation interval constraint and obeying the current schedule. For information on optimizing functional unit allocation and minimizing the interconnect, please see co-pending U.S. patent applications Nos. 09/378,431 and 09/378,295, by Robert S. Schreiber, entitled "FUNCTION UNIT ALLOCATION IN PROCESSOR DESIGN" and "INTERCONNECT MINIMIZATION IN PROCESSOR DESIGN," which are hereby incorporated by reference.

5.7 Post Scheduling Clean-up (632)

After the operation binding stage, the back end enters a post-scheduling clean up phase (730). In this phase, it deletes the universal register file from the AIR data path representation to be replaced shortly by an exact customized interconnect and storage. The functional unit data widths may be adjusted at this stage based on the specific operations mapped to each functional unit. The data width of each functional unit need only be wide enough to support the specific operations mapped to the functional unit. The data width for each functional unit, therefore, is adjusted accordingly.

5.8 Bind Variables to Register Files (634)

Binding variables to register files is the process of selecting a register or register file for each operand in the loop body code. In the current implementation, the back end programmatically binds variables to register files based on a scheme where one static register is assigned to each static variable and one rotating register file is assigned to each EVR. The number of registers in each file correspond exactly to the needs of the EVR bound to it.

In an alternative implementation, the back end optimizes the variable to register binding in a similar manner as the process of optimizing the operator to FU binding. In this approach, the back end selects a mapping of variables to register files from among the allowable mapping choices and exploits sharing of registers/register ports while minimizing the interconnect. The back end programmatically maps each variable to a register so as to reduce cost while satisfying the performance constraint (e.g., the initiation interval). This cost reduction focus on minimizing the cost of the interconnect, the cost of the register files, or both. As explained above, the cost of the interconnect is measured in area or gates of the select logic and the topological complexity of the wiring, which tend to increase when resources are shared. In particular, sharing register files, registers and register ports usually requires additional select or mux logic to select the appropriate inputs for the shared register resource at a given time. The cost of the register files is measured in the width of the registers, number of register ports, and the number of registers.

The operator to FU binding and variable to register binding may be combined to yield an optimized interconnect, functional unit and register file implementation.

5.9 Overview of Process for Completing Processor Array Structural Description

Figure 19:
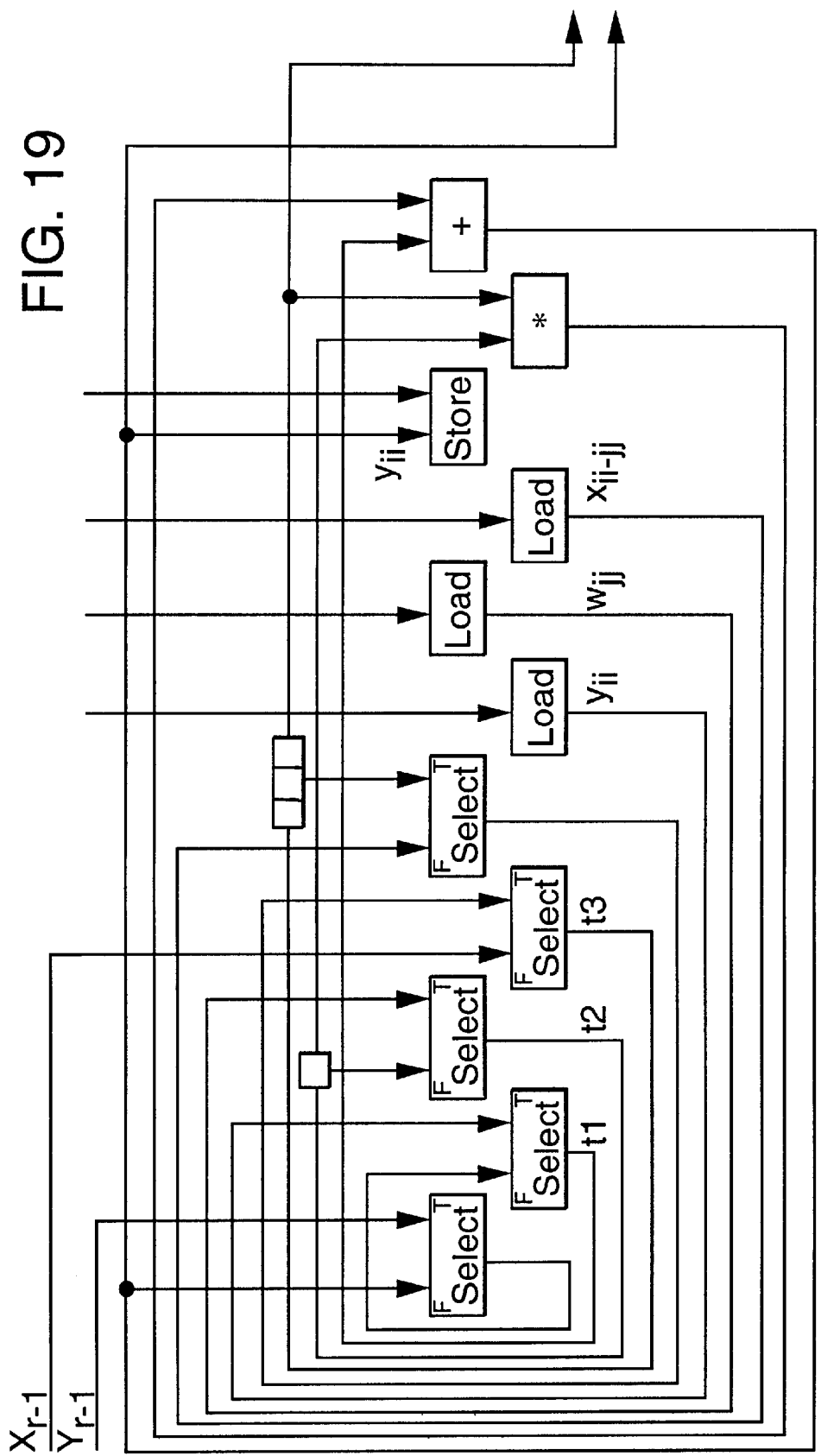
FIG. 19 is a diagram of a revised version of the data path design after operation scheduling.
Figure 20:
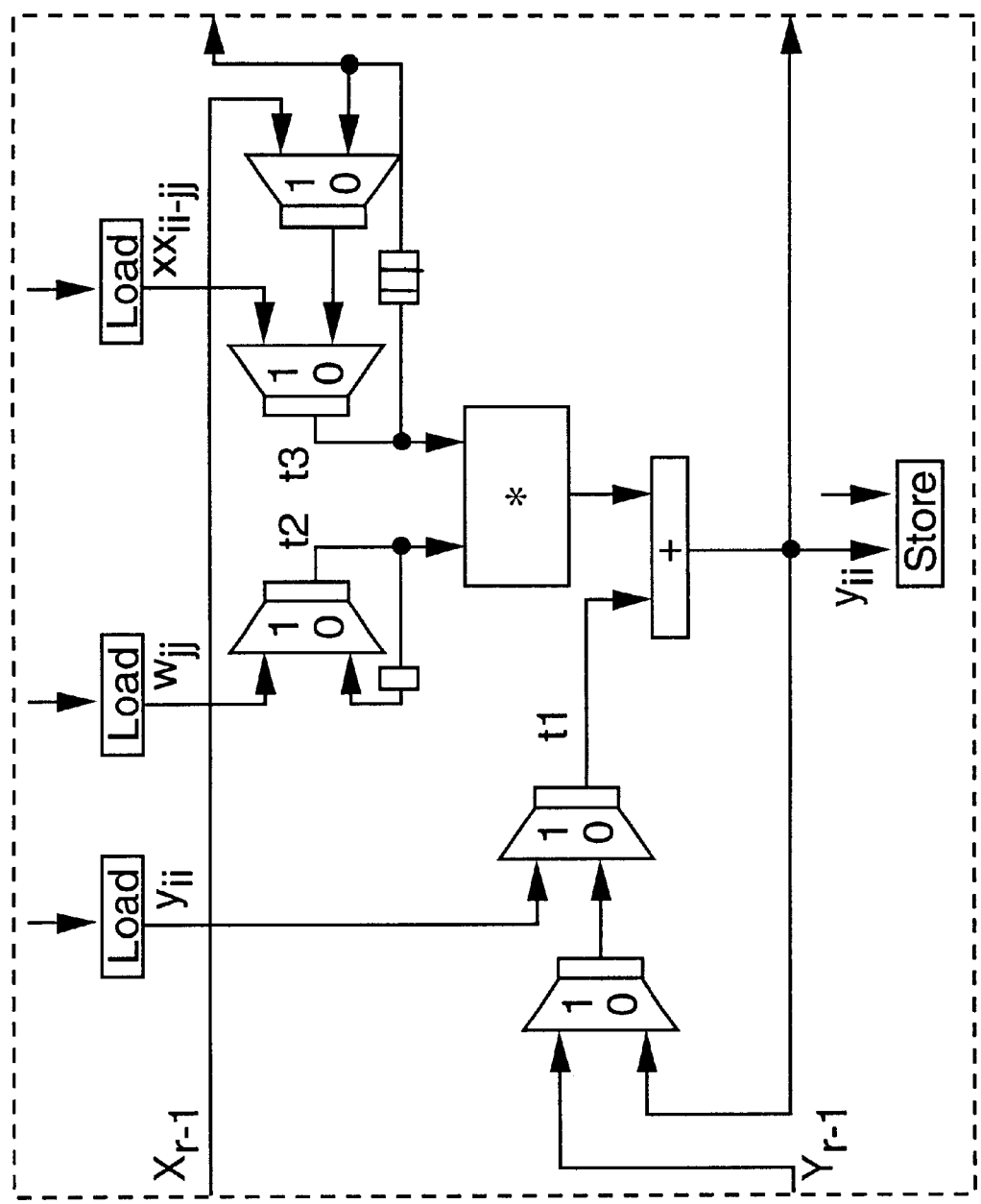
FIG. 20 is a schematic diagram of a customized data path corresponding to the data path shown in FIG. 18.

After scheduling operations and making the binding decisions, the back end proceeds to build the data path (732) of each processor element, including an AIR representation of its registers and interconnect which will be described in more detail shortly. FIG. 19 shows an example of the processor element in our running example with a reduced interconnect. FIG. 20 shows an example of the processor element after mapping the loop body to specific macrocell instances.

Figure 21:
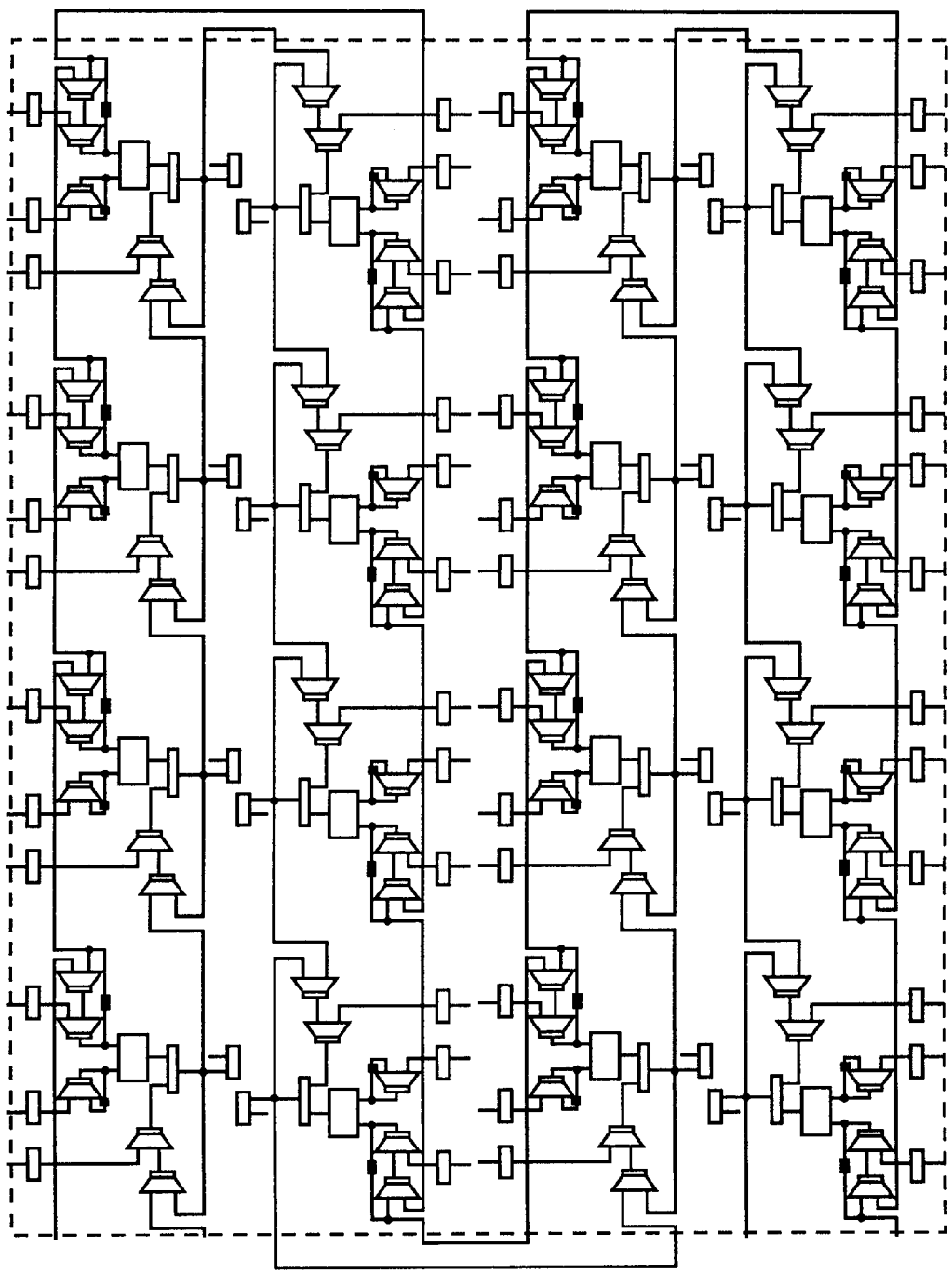
FIG. 21 is a schematic diagram of an array of the data path element shown in FIG. 20.

After constructing the structural description of the processor elements, the back end generates the processor array (734) such as the one shown in FIG. 21. It converts the AIR representation into VHDL (736) by traversing the AIR data structures and extracting a VHDL description for the components net list. Each component in the AIR representation stores a reference to a corresponding VHDL representation in a separate library. The code for generating the VHDL links these library components with the extracted VHDL net list.

Figure 22:
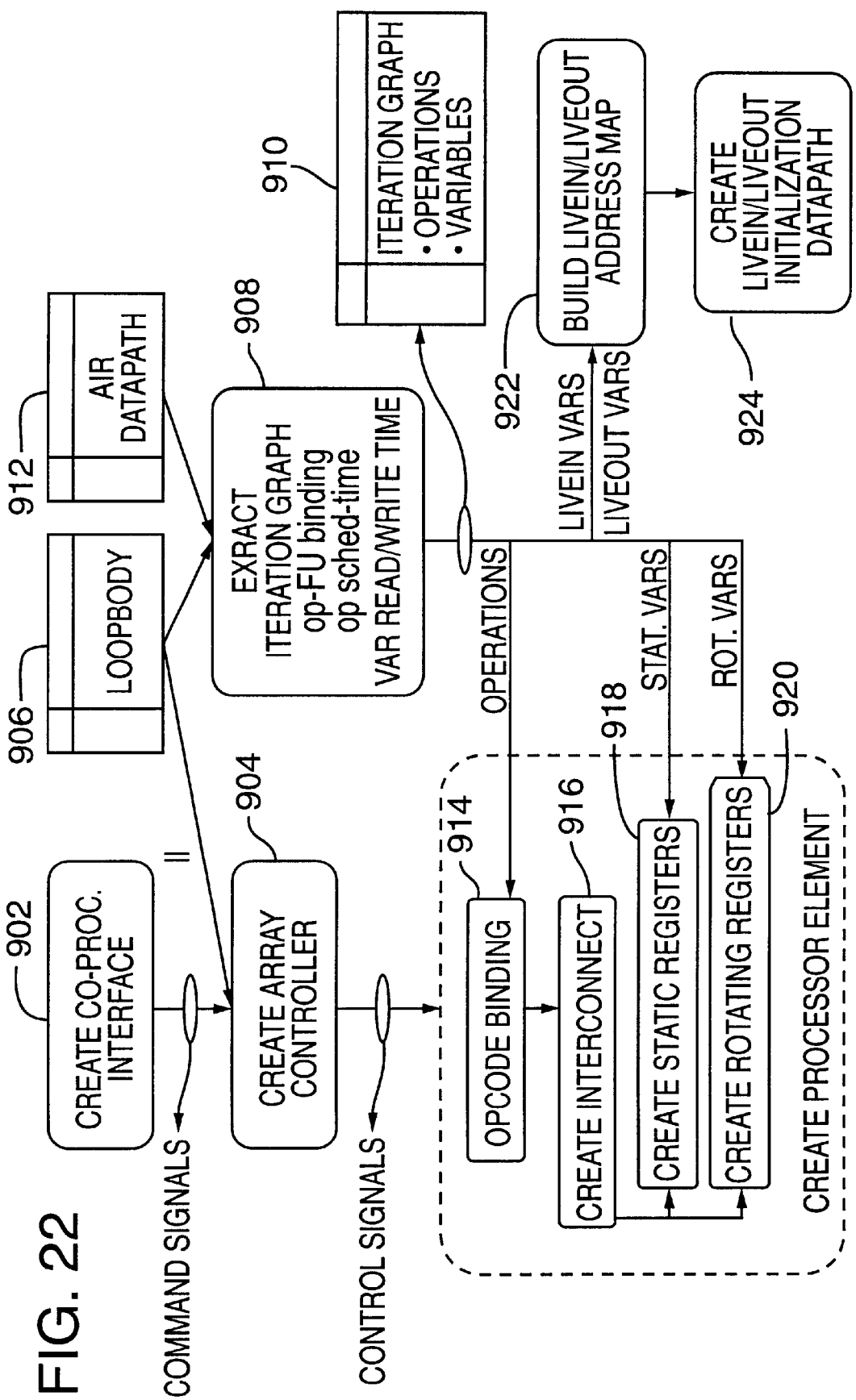
FIG. 22 is a design flow diagram illustrating a system and methodology for synthesizing the control logic, local storage and interconnect for a processor array.

The remaining sections describe how to create the processor element, how to replicate the processor elements into an array, how to create the interconnect of the elements, and how to create the control, data and memory interface of the array. FIG. 22 illustrates a design flow for completing the processor array design. This particular design flow is based on the system level design scheme shown in FIG. 23 and the processor level design scheme shown in FIG. 24.

5.10 Create Processor Element

To complete the processor element design, the back end creates the interconnect and the static and rotating registers for the processor elements in the array. The static registers correspond to loop invariants, such as base addresses of arrays in the loop body, and possibly non-uniformized variables. The rotating registers correspond to the uniformized arrays, and in particular, the EVRs.

As reflected in module 908, the synthesis process constructs an internal data structure called the iteration graph 910 from the loop body 906 and the AIR representation of the data path 912. This data structure includes the operation to FU-binding, the variable to register binding, the operation schedule times, and the read/write times of each variable taken from the schedule. This information is used to synthesize a description of the hardware as described below.

5.10.1 Opcode Binding (914, FIG. 22)

Based on the operation FU to binding, the back end first collects all operations bound to the same functional unit. Using the scheduled start times of each operation and the opcode encoding from the MDES, it then constructs the control logic representing the opcode scheduled at each cycle, filling empty cycles with no-ops(914). The current implementation employs distributed opcode binding. An alternative is to centralize the opcode control into a single device, such as a ROM or PLA, that distributes control signals to each functional unit in response to a timing signal (e.g., from a program counter) at every cycle.

5.10.2 Create the Interconnect and Static and Rotating Registers (636, 638)

The back end creates the interconnect (916) as well as the static and rotating registers (918,920).

Based on the phase signal from the phase bus, the select logic at each register controls the transfer of data from the functional unit to the appropriate register.

At this point in the synthesis process, the transformed code indicates which operation or operations produce a value to each register, and which operation or operations consume a value from each register. Also, since the operations are assigned to specific functional units, the transformed code also indicates the functional units that produce values to and consume values from each register.

Based on this information, the back end creates static registers to correspond to the static variables in the iteration graph and connects the register ports to the functional units using them via the interconnect in a manner described shortly (918).

Similarly, the back end creates rotating registers to correspond to the rotating variables in the iteration graph and connects its read/write ports to the functional units using them via the interconnect as described below (920). The exact offset of the read port in each EVR is determined by the scheduled time of the consuming operation. Similarly, the exact offset of the write port in each EVR is determined by the scheduled time of the producing operation.

In the implementation, an EVR is synthesized into a FIFO buffer in the form of shift register that shifts every initiation interval, but whose individual registers can be loaded at any point during an initiation interval. A predicate controls loading of data into each register. If no new value is written to a register with its predicate enabled for a time slot, the register holds the value at the end of that time slot. However, at the end of II cycles, each register in the FIFO shifts in the value from its previous register stage (here, II is the specified initiation interval).

To create the interconnect, the back end needs to determine how each stage in the shift register is connected to its corresponding functional unit. For a producer, the back end determines the shift register stage to direct the output value and corresponding predicate from the functional unit. The back end follows a convention specifying that reads occur at the beginning of a clock cycle and writes occur at the end of a clock cycle. The back end determines this stage by determining the write time from the operation schedule as follows:

(schedule time of producer operation+output latency of data being produced−1)

The write stage in the FIFO is calculated as:

write time/*II*+time distance

For a consumer, the back end determines the stage of the shift register by calculating the read time from the operation schedule as follows:

consumer schedule time+input latency

The read stage in the FIFO is calculated as:

read time/*II*+time distance

The back end determines the time distance as the index of the EVR at that reference in the transformed loop.

This process identifies the stage of the register that needs to be connected to the input mux of the corresponding functional unit. With this information, the back end instantiates the muxes at the inputs of the functional units and the select logic at the inputs of the registers and interconnects them with wiring as described below.

Figure 24:
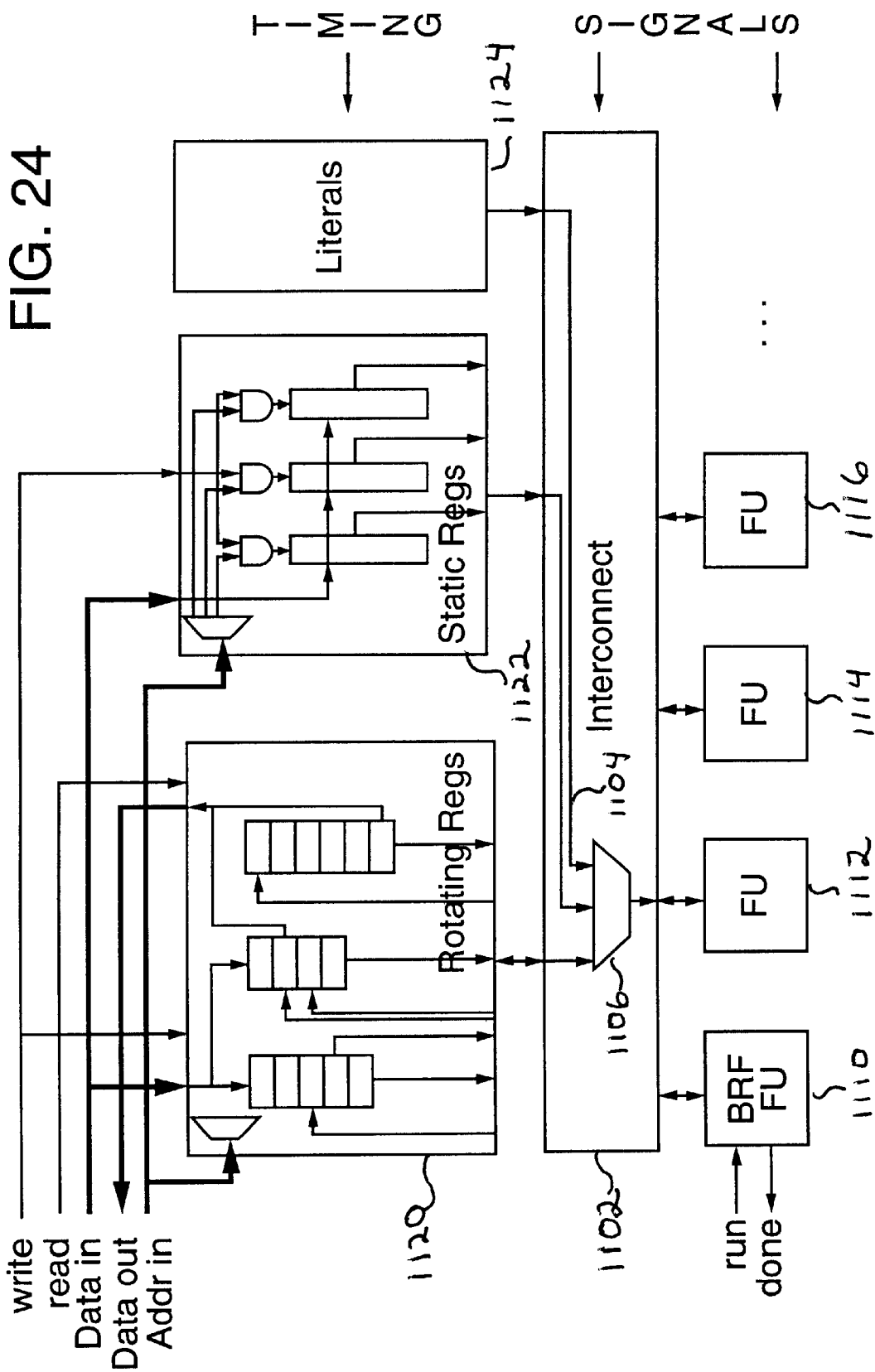
FIG. 24 is a block diagram illustrating an example of a data path for a processor array.

As shown in FIG. 24, for example, the interconnect 1102 comprises wires 1104, muxes 1106 and select logic that interconnect the functional units 1110–1116 with registers (rotating 1120, static 1122 and literals 1124). In the current implementation, the schedule plays an important role in determining the interconnect 1104. The implementation employs a schedule based control scheme in which muxes with initiation interval inputs are used to select the appropriate source to each input of every unit at every time step. At each input of a functional unit, a multiplexor receives data from the registers (e.g., rotating, static and literals) and a timing signal from the controller specifying the time step (modulo the initiation interval) in the current schedule. Based on this time step, the multiplexor selects the appropriate data and feeds it to the functional unit.

The output interconnect form the functional units to the various registers employs a predicated control scheme. Each output of a functional unit produces a predicate signal that signifies the times at which the corresponding output data is valid. The predicate signal is further combined with a decoded time bus signal (e.g., the phase signal from a phase bus described below) using an AND operation to take into account the scheduled time of writing to a specific destination register. This phased predicate-data pair is then wired to the register that is supposed to receive the output of the functional unit.

At each register, predicate and data pairs from multiple functional units writing at different phases are merged together using a select unit. The predicated compilation scheme guarantees that only one predicate-data pair will be active at any given phase.

5.11 Replicate and Interconnect Processor Elements (640)

Since a processor array consists of multiple processing elements, the back end replicates the hardware created for one processor element multiple times. These replicated processor elements also need to be connected to each other. The array topology specifies which processor elements communicate with each other. The annotation file contains the set of variables that one processor communicates to another. The synthesis process uses this information to create appropriate datapaths among processor elements. The register offsets to from/write to are determined as described above, although across different processor elements.

5.12 Create Co-Processor Interface (642)

Figure 23:
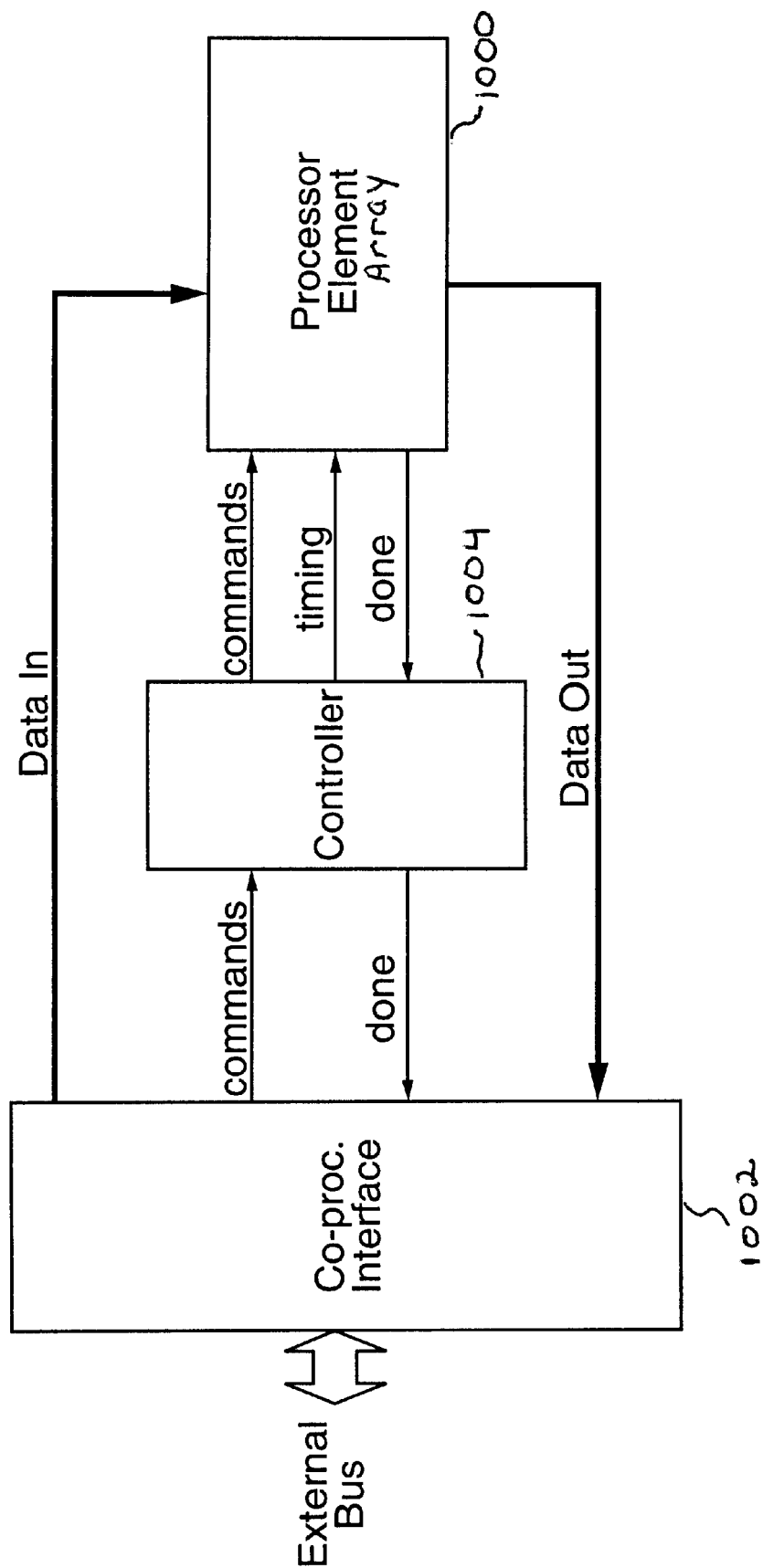
FIG. 23 is a block diagram illustrating an interface between a host processor and a processor array.

In the system level scheme shown in FIG. 23, the processor array 1000 is connected to the host processor via an external bus, co-processor interface 1002 and controller 1004. Connected to the host processor via an external bus, the co-processor interface 1002 makes the live-in/live out variables implemented in the processor array as registers appear as the host processor's local memory.

5.12.1 The Control Interface

To initiate execution of a loop nest, the host issues a command to the co-processor interface by writing to a specific local memory address. The co-processor interface then issues a command to initiate a loop nest to the controller 1004, which in turn, issues a command and timing signals to the processor array 1000. When it has completed execution of the loop nest, the array sends a signal indicating the loop is done to the controller, which passes this signal back to the co-processor interface from where the status may be queried by reading from a specific local memory address.

The address layout of the interface includes command field and a register address. For a write operation, the commands include commands to initialize a static register, to initialize a rotating register, to initialize a loop counter, and to initiate execution of the nested loop ("run"). For a read operation, the commands include commands to read whether the loop is done, and to read a rotating register containing live-out values. The interface decodes the input address to a specific live-in/live-out register in the processor array.

The interface provides the system clock signal to the processor array and transfers data to and from the array by writing/reading from an encoded local memory address. This is accomplished by encoding the appropriate command to read/write a register along with the register's assigned address into the local memory address.

In summary, the sequence of steps for controlling the processor array in the implementation are:
1. Write the static live-in registers;
2. Write rotating live-in registers;
3. Write loop counter; and
4. Issuing the command to run the loop nest on the processor array.

5.12.2 The Data Interface

Returning again to FIG. 22, we now explain how the back end completes the processor array synthesis for the schema shown in FIGS. 23 and 24. The back end constructs the co-processor interface based on the memory address mappings in the annotation file, and a fixed set of pre-determined commands as explained above (902). The co-processor interface includes a data interface and a control interface as noted above. The host processor views the memory within the processor array as a single local memory address space. Note that this local memory address space is separate from the global memory address space used by the host processor and the systolic array. This scheme for controlling data flow is just an implementation detail, and not a necessary restriction on the design flow. Other alternative approaches are possible, such as treating the local processor element storage as host processor's global memory accessed in global memory operations or as a specialized register file accessed via special operations.

The host invokes local memory operations to load and store data to and from its local memory view of the processor array memory. The co-processor interface implements a map from the processor's local memory view to actual registers in the processor array (and possibly any memory shared by the processor elements).

Various alternative addressing schemes may be used to address registers in each processor element. One way is to address individual registers using offsets from a fixed base address assigned to each processor element. In this scheme, registers within different processor elements map at fixed offsets from the base address assigned to each element. The number of bits needed for specifying the offset and the processor element base as well as the actual mapping between processor element registers and local memory offsets are determined during the synthesis phase and are stored as parameters in the annotation file. During a local memory load/store operation the base bits select the appropriate processor element and the offset bits select the register within the element. The processor elements other than the selected one are disabled.

The above memory scheme may be extended or optimized in various ways. For example, certain data such as loop constants and element-independent initializations may be shared among all elements. Storage for this data may be implemented in a shared local memory of the processor array. Alternatively, the data may be broadcast to certain registers within each element using a special "broadcast" address.

5.12.3 The Memory Interface

In addition to the control and data interface shown in FIG. 23, the processor array also has a memory interface to global memory. The processor elements within the array perform loads and stores to the main memory in a similar fashion as the host processor. However, the current implementation, the processor elements bypass the primary cache because the array is designed to reuse data internally and can tolerate high memory latency.

The design of the array as shown in previous sections ensures that the average memory bandwidth required by the array is matched to the overall memory bandwidth provided on chip. It is difficult to schedule the memory requests such that the number of instantaneous memory requests from the various processor elements never exceeds the actual number of memory ports on the chip. Therefore, we utilize a mechanism to arbitrate among simultaneous memory requests and buffer their results while still providing the view of an architecturally "fixed" memory latency. We describe this mechanism here briefly.

Every processor element that needs to perform memory operations contains as many load/store units as the number of possibly concurrent memory requests. All such load/store units are connected to the memory bus via a memory controller that performs bus arbitration and buffering. For the sake of this discussion, we assume there is only one memory port on the chip. The memory controller and the entire memory subsystem are assumed to be pipelined, capable of handling one memory request every cycle.

During normal operation when there is only one request per cycle, it is granted immediately (possibly the next cycle). For store operations the address and data are presented to the memory controller simultaneously; for loads, the address is presented to the controller and the result is transferred back to the requesting unit by the controller after a pre-defined number of cycles (memory latency).

If there are multiple load requests in the same cycle, the controller grants them one by one recording the unit number these requests came from. The systolic array is meanwhile stalled to prevent any more requests from accumulating. The pipelined replies from earlier transactions appearing on the memory bus during these stall cycles are also buffered within the controller. These replies are presented as normal output of the controller as soon as the request stall cycles are over. After a pre-defined number of cycles, all the results of the virtually concurrent load requests have returned back into the controller's buffer. The controller then stalls the systolic array once more and stores back the results into the appropriate units giving the appearance of concurrent replies returning back from the memory system. Or it may provide all the results present in its buffer to the systolic array in parallel without stalling it.

5.13 Create Array Controller (644)

As shown in FIG. 23, the array controller 1004 provides the timing signals to the processor array. When instructed to start execution of the nested loop, the controller issues time step signals specifying the time step within each initiation interval. It implements this function in a counter that counts from zero to (II-1) and repeats. The counter provides the time step via a time slot bus. The time slot bus signals control the muxing at the inputs to the functional units in each processor element. The controller also includes a decoder that converts the time step into a phase signal and provides this phase signal on a phase bus. The phase bus controls the select logic at the input of the register files.

The back end constructs the array controller (904) based on information from the loop body 906 and the initiation interval. The controller is responsible for issuing timing signals to the processor array. In particular, it keeps track of initiation intervals and rotates registers at the appropriate times. From the macrocell database, the back end creates an instance of the loop counter as well as the logic to control it. In addition, it instantiates the time slot bus and phase bus and creates the decoder to convert the time bus signals to the phase signals.

5.14 Build Livein/Liveout Address Map

Based on the live in/live out variables in the iteration graph, the back end constructs a livein/liveout address map (922) between the corresponding registers and their local memory addresses.

5.15 Create Livein/Liveout Intitialization Datapath

Finally, the back end creates the livein/liveout initialization data path (924) to decode the addresses and initialize the registers.

6.0 Design Flow for Synthesizing Programmable Processor Elements

Figure 25:
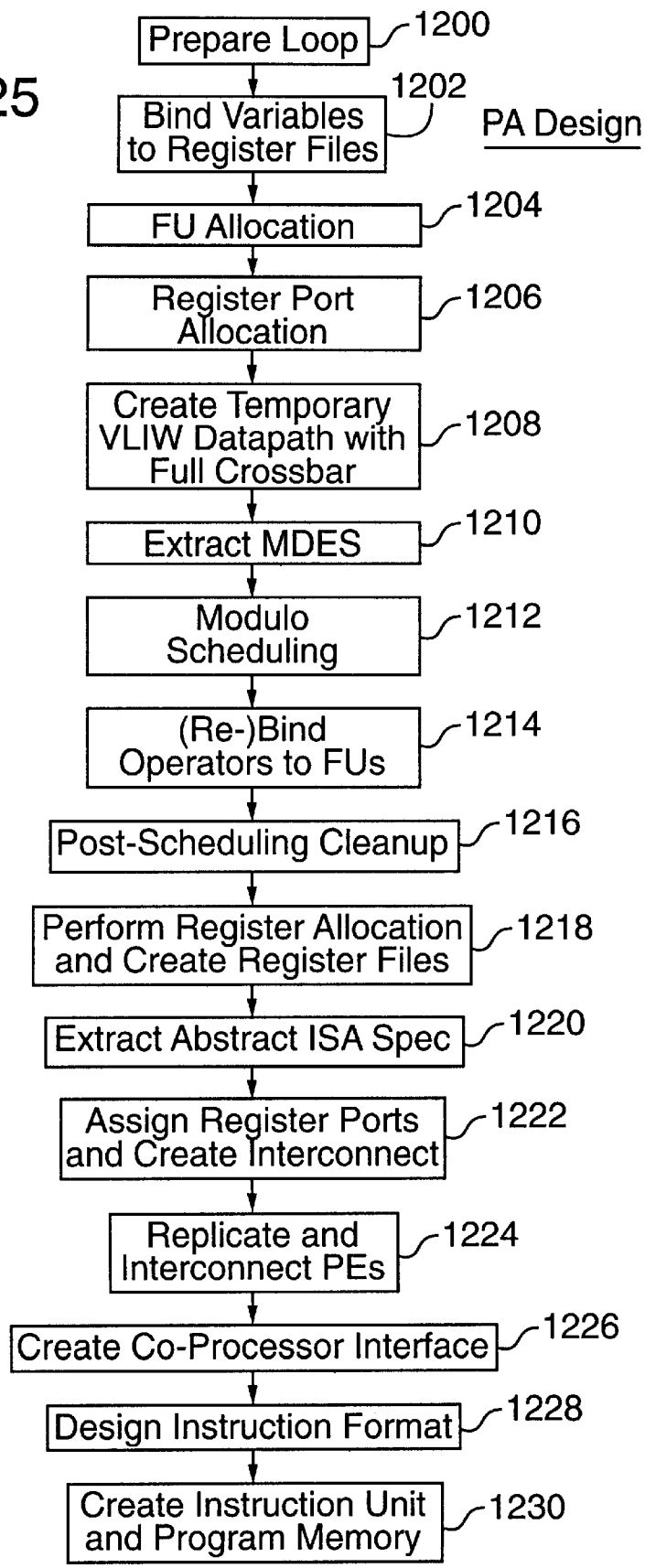
FIG. 25 is a flow diagram of a process for synthesizing an array of programmable processor elements from input including a code listing of a single loop nest.

As noted above, the back end may be designed to synthesize the parallel processes generated in the front end into an array of programmable processors. This process, which is depicted in the flow diagram of FIG. 25, is similar to the synthesis process for a non-programmable array. In addition, the process includes the design of the programmable processors' instruction format and the instruction unit for issuing VLIW instructions from program memory to the control points in processor elements' data paths. Each of the phases of the programmable array synthesis process illustrated in FIG. 25 are described below, with each section cross-referenced to the flow diagram.

6.1 Prepare Loop

This phase is implemented in the back end compiler as described above in the NPA synthesis process.

6.2 Bind Variables to Register Files

Since this is a programmable processor element, and since it is desirable to be able to compile code to it, the registers are structured as one or more register files. A single register file, to which all the FUs are connected, is easiest from the compiler's point of view. However, a single register file might require a very large number of ports, which would result in expensive and slow hardware. Therefore, in processor elements with many FUs, it is preferable to have multiple, smaller register files, each of which is connected to just a subset of the FUs. The choice of the number of register files and the binding of each of the variables in the code to one of the register files is done in such a way as to reduce the number of FUs that will have to access each register file, to an acceptable level.

The binding of variables to register files tries to adhere to certain rules. Variables of the same type and bit width are bound to the same register file as far as possible. By and large, all of the operands of an operation are bound to the same register file. Often, this requires the insertion of copy operations into the code. At the end of this step, the code is in a form such that, if the copy operations are ignored, the code is partitioned into as many sub-computations as there are register files. For the most part, each of these sub-computations is treated separately in the following steps.

6.3 FU Allocation

The FU allocation process is the same as for the NPA case, except that it is separately applied to the sub-computation corresponding to each register file. Thus, there will be a distinct set of FUs that connect to each register file. The exceptions are the "copy FUs" which read from one register file and write to another.

6.4 Register Port Allocation

For each register file, the number of read accesses and the number of write accesses per loop iteration are counted. This determines the number of read ports and write ports that are needed by each register file in order that the required initiation interval is achievable. The number of ports of each type is computed using the techniques employed for FU allocation. The accesses and ports correspond to the operations and FUs, respectively.

6.5 Create Temporary VLIW Datapath

At this point, a temporary VLIW datapath is created which consists of the register files and the FUs. The connectivity between the FUs that access a given register file, and that register file's ports, is assumed to be complete, i.e., each FU input port can access any read port of the register file, and each FU output port can access any write port.

6.6 Extract MDES

This phase is the same as for the NPA case.

6.7 Dependence Graph Construction and Modulo Scheduling

This phase is the same as for the NPA case except for two things. First, the operations of one sub-computation are constrained to be scheduled on the corresponding FUs. Second, the register file ports are also viewed as resources which cannot be permitted to be oversubscribed on any cycle.

6.8 (Re-)Bind Operators to FUs

This phase is the same as for the NPA case.

6.9 Post-Scheduling Cleanup

This phase is the same as for the NPA case except that it deletes the complete interconnect between the register file ports and the FU ports.

6.10 Perform Register Allocation and Create Register Files

Register allocation is performed separately for the set of variables bound to each register file. Each such set of variables is bound to specific registers in the register file in such a way as to minimize the total number of registers. Normal virtual registers and EVRs are allocated separately into the static and rotating sections of the register file. Together, this determines the number of registers per register file.

At this point, each register file can be created. The number of static and rotating registers in each is known, as is the number of read and write ports. However, at this point, the connectivity between the register file ports and the FU ports is yet to be specified.

6.11 Extract Abstract ISA Specification

In this stage, the back end extracts the Abstract ISA Specification from a datapath specification of a processor element.

The opcode repertoire is determined by examining the code. Each opcode constitutes an Operation Set. The I/O Format for each opcode (i.e. a mapping of the operands of the corresponding operation to registers/register files) is determined by examining the binding of its operands to the register files. The register file specification, consisting of the number of register files and the number of registers in each register file, is obtained by inspecting the register files that have been created. A specification of the desired instruction-level parallelism, in the form of Concurrency Sets, is obtained by seeing which opcodes are issued concurrently in the schedule created by the modulo scheduler.

For a description of this programmatic process in the context of VLIW processor design, see co-pending U.S. patent application Ser. No. 09/378,395, filed concurrently and entitled, "AUTOMATIC DESIGN OF VLIW PROCESSORS" by Shail Aditya Gupta, Bantwal Ramakrishna Rau, Vinod Kumar Kathail, and Michael S. Schlansker which is hereby incorporated by reference.

6.12 Perform Register Port Assignment and Create the Interconnect

Using the Abstract ISA Specification, the back end performs register port assignment. This programmatic process determines which register file ports are accessed by each FU port. For more information on this programmatic process in the context of VLIW processor design, see co-pending U.S. patent application Ser. No. 09/378,395, filed concurrently and entitled, "AUTOMATIC DESIGN OF VLIW PROCESSORS" by Shail Aditya Gupta, Bantwal Ramakrishna Rau, Vinod Kumar Kathail, and Michael S. Schlansker, which is hereby incorporated by reference.

At this point, the interconnect between the FU ports and the register file ports is created.

6.13 Replicate and Interconnect Processor Elements

This process is the same as described above for the NPA design flow.

6.14 Create Co-Processor Interface

This process is the same as described above for the NPA design flow.

6.15 Design Instruction Format

Using the Abstract ISA Specification for a single processor element, the Concrete ISA Specification, which includes the instruction format, is designed as described in co-pending U.S. patent application Ser. No. 09/378,293, filed concurrently and entitled AUTOMATIC DESIGN OF VLIW INSTRUCTION FORMATS, by Shail Aditya Gupta, Bantwal Ramakrishna Rau, Richard Craig Johnson, and Michael S. Schlansker, which is hereby incorporated by reference. This process is the same for all of the processor elements in the array.

6.16 Create Instruction Unit and Program Memory

Using the Concrete ISA Specification and the datapath design, the Instruction Unit is designed as described in co-pending U.S. patent application Ser. No. 09/378,395, filed concurrently and entitled, "AUTOMATIC DESIGN OF VLIW PROCESSORS" by Shail Aditya Gupta, Bantwal Ramakrishna Rau, Vinod Kumar Kathail, and Michael S. Schlansker.

One difference is that the Instruction Cache is replaced by a Program Memory. Another difference is that since all processor elements execute identical instructions on every cycle, a single Instruction Unit and Program Memory may be shared by all the processor elements. Alternatively, each processor element can have its own copy of the Instruction Unit and Program Memory. Intermediate choices are also available; for instance, just the sequencer may be shared, but the Program Memory and control path may be replicated. The least expensive alternative is chosen.

7.0 Alternatives

Although the preceding sections describe specific implementations of a processor array design flow, the invention is not limited to these implementations. Components of the system may be used in various combinations for different design scenarios. In addition, the methods apply to a variety of parallel processor architectures and are not limited to synchronous processor arrays or co-processors that operate in conjunction with a host processor.

The parallel compiler methods for transforming a sequential nested loop into a parallel program, for example, apply to a variety of parallel computing architectures, including both synchronous and asynchronous processor systems. For asynchronous processor systems, such as network of computers, the parallel compiler techniques described above may still be applied. However, explicit synchronization code may be added whenever synchronization is needed to guarantee that the correct data is referenced. While it is particularly advantageous to generate a parallel program for synthesis into an application specific design, it is also possible to use the parallel compiler techniques for an existing or given multi-processor architecture.

Some implementations may omit or use alternatives to the processes used in the implementation of the front end parallel compiler and the back end synthesis system. For example, developers of alternative implementations may choose to omit tiling, may use alternative scheduling methodologies, may omit or use alternative loop and control code schemes and their optimizations.

The methods and system components may be used to design multiple processor arrays. In some applications, for example, the input program may include several loop nests. These loop nests may be extracted, transformed to parallel processes, and synthesized into distinct processor arrays or cast onto a single multi-function processor array.

The methodology and system design described enables the use of parallel compiler and ILP compiler technology to optimize the parallel code and the hardware synthesized from this parallel code. Examples of the parallel compiler technologies include tiling, uniformization or privatization, iteration mapping, clustering, uni-modular loop transformation and non-unimodular loop transformation. The implementation exploits ILP compiler technology such as the use of predication and related optimizations (e.g., predicated query system) used in data flow analysis, if-conversion and critical path reduction. Other examples include the use of EVRs, compile time speculative code motion, region formation, operation scheduling and strength reduction.

As noted above, the processor elements in the array may be synthesized programmatically, or may be selected from available processor designs. Moreover, the programmatic synthesis process may synthesize a non-programmable custom data path, such as a synchronous, non-programmable processor element array, or some alternative processor type such as an EPIC (e.g., VLIW) or superscalar processor. The processor elements may be programmable with a user visible instruction set and RAM for storing a program, or may be non-programmable with a scheduled program hard-wired into control logic (e.g., a FSM) or stored in ROM.

In view of the many possible implementations of the invention, it should be recognized that the implementation described above is only an example of the invention and should not be taken as a limitation on the scope of the invention. Rather, the scope of the invention is defined by the following claims. We therefore claim as our invention all that comes within the scope and spirit of these claims.

We claim:

1. A programmatic method for transforming a nested loop into a set of parallel processes for synthesis into a parallel array of processor elements, the method comprising:

obtaining the nested loop and a performance requirement for executing the nested loop as parallel processes on the array of processor elements, where the nested loop has a loop body with one or more operations;

based on a specified performance requirement, programmatically transforming the nested loop into parallel processes for synthesis into an array of processor elements, where each of the parallel processes corresponds to a set of iterations of the loop body, expressed as a single loop mapped to a processor element, and where each iteration is assigned a start time to initiate execution on the processor element; and generating code representing the transformed nested loop as a two dimensional loop in which a first dimension iterates over time and a second dimension iterates over processor elements.

2. The method of claim 1 wherein the performance requirement includes a memory bandwidth constraint on the processor elements.

3. The method of claim 2 including:

performing a data dependence analysis on operations in the loop body to determine data dependence constraints between iterations, the data dependence constraints including a delay constraint of a recurrence cycle; and based on the data dependency constraints, determining the iteration schedule such that the iteration schedule satisfies the dependence constraints.

4. The method of claim 2 further including:

transforming the nested loop from iteration space coordinates to time—virtual processor coordinates, where the nested loop is expressed in a two dimensional loop in which a first dimension iterates over time and a second dimension iterates over virtual processors; and transforming the nested loop from time—virtual processor coordinates to time—physical processor element coordinates, where the nested loop is expressed in a two dimensional loop in which the first dimension iterates over time and the second dimension iterates over physical processor elements, in transforming the nested loop to time—physical processor coordinates, assigning clusters of virtual processors to physical processors.

5. The method of claim 1 further including:

transforming the loop body into a dynamic single assignment form by converting an array in the loop body into a uniformized array.

6. The method of claim 2 including:

programmatically partitioning the nested loop into sets of iterations to be initiated sequentially so as to minimize local storage of the processor elements while satisfying the memory bandwidth constraint.

7. The method of claim 2 wherein programmatically transforming the nested loop includes:

determining an iteration schedule for iterations of the nested loop such that the schedule provides start times for initiating execution of the iterations on a processor element such that no more than one iteration is started on a processor element for each initiation interval.

8. The method of claim 5 further including:

generating code to represent the array in the dynamic single assignment form, along with a specification of registers that implement the array in local storage of each processor element.

9. The method of claim 5 including:

programmatically transforming the loop nest so as to eliminate accesses to or from global memory from the processor elements, except as necessary at loop boundaries.

10. The method of claim 1 including:

generating code to test a loop index against a loop bound index vector of the nested loop locally on a processor element using a previous value of the test computed in a previous iteration on the same processor element.

11. The method of claim 1 generating code of a conditional statement determining whether an iteration is at a loop boundary, where the loop boundary is a tile, cluster, or iteration space boundary.

12. The method of claim 11 including:

generating code to compute a boolean variable of the conditional statement from a previous value of the boolean variable at a previous iteration in the nested loop.

13. The method of claim 11 including:

converting operations in the loop body that are dependent on the conditional statement into predicated code; and synthesizing functional units for the processor elements that support predicated execution of the predicated code.

14. A computer readable medium on which is stored software, which, when executed by a computer, performs the method of claim 1.

15. A programmatic method for synthesizing a set of parallel processes, each comprising a single loop in parallel form, into a parallel array of processor elements, the method comprising:

synthesizing a structural representation of a data path for a processor element that executes the single loop based on operations in the single loop;

scheduling the operations in the single loop for execution in the data path so as to satisfy a specified processor cost or performance constraint;

programmatically synthesizing an interconnect between functional units and local storage in the data path for each processor element; and programmatically replicating and interconnecting the processor elements into a parallel array that satisfies the processor cost or performance constraint.

16. The method of claim 15 including:

transforming code of the loop such that when synthesized into a structural description of a processor element, the structural processor element has a minimized cost measured in chip area, complexity of interconnect, number of hardware elements or power consumption.

17. The method of claim 15 including:

transforming code of the loop such that when synthesized into a structural description of a processor element, the structural processor element has an optimized performance measured in execution time.

18. The method of claim 15 wherein the processor elements are programmable processor elements.

19. The method of claim 15 wherein the processor elements are non-programmable processor elements.

20. The method of claim 15 including:

converting conditional statements in the code to predicated code.

21. The method of claim 20 including:

synthesizing the predicated code into the structural representation of the data path and the interconnect of a processor element.

22. The method of claim 15 including:

performing one or more of the following code transformations before synthesizing the code into a processor element: dead code elimination, copy propagation/elimination, loop invariant removal, partial redundancy elimination, and common sub-expression elimination, strength reduction, constant propagation and folding, critical path reduction and speculative code motion;

wherein the code transformation transforms the code so as to optimize the synthesized processor element.

23. The method of claim 22 wherein one or more of the code transformations are applied to predicated code in which conditional statements are converted to predicates.

24. The method of claim 22 wherein one or more of the code transformations are applied to code including expanded virtual registers representing uniformized arrays.

25. A computer readable media on which is stored software, which when executed by a computer, performs the method of claim 15.

26. A computer readable media on which is stored software, which when executed by a computer, performs the method of claim 15.

27. A processor element array comprising:

an array of processor elements, each having one or more functional units for executing operations, one or more registers for storing inputs and outputs of the operations, and an interconnect for connecting registers to functional units;

the functional units supporting predicated execution of the operations and producing output for the operations as predicate-data pairs; and the interconnect using the predicates to control transfer of data from the functional units to corresponding registers.

* * * * *